(12) United States Patent
Lee et al.

(10) Patent No.: US 12,183,771 B2
(45) Date of Patent: Dec. 31, 2024

(54) DISPLAY DEVICE

(71) Applicant: Samsung Display Co., Ltd., Yongin-si (KR)

(72) Inventors: Seung Geun Lee, Hwaseong-si (KR); Byung Ju Lee, Eunpyeong-gu (KR); Hoo Keun Park, Yongin-si (KR); Chul Jong Yoo, Seongnam-si (KR); Dong Eon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 515 days.

(21) Appl. No.: 17/520,227

(22) Filed: Nov. 5, 2021

(65) Prior Publication Data

US 2022/0173158 A1 Jun. 2, 2022

(30) Foreign Application Priority Data

Nov. 30, 2020 (KR) ........................ 10-2020-0163674

(51) Int. Cl.
*H01L 27/15* (2006.01)
*H01L 33/38* (2010.01)
*H01L 33/62* (2010.01)

(52) U.S. Cl.
CPC .......... *H01L 27/156* (2013.01); *H01L 33/382* (2013.01); *H01L 33/62* (2013.01)

(58) Field of Classification Search
None
See application file for complete search history.

(56) References Cited

U.S. PATENT DOCUMENTS 9,307,596 B2  4/2016  Kang et al.
9,570,425 B2  2/2017  Do
(Continued)

FOREIGN PATENT DOCUMENTS

JP     2004-288827 A    10/2004
KR  10-2014-0100049 A    8/2014
(Continued)

OTHER PUBLICATIONS

International Search Report dated Mar. 14, 2022 for corresponding PCT Application No. PCT/KR2021/017829 (3 pages).
(Continued)

*Primary Examiner* — Long Pham
(74) *Attorney, Agent, or Firm* — Lewis Roca Rothgerber Christie LLP

(57) ABSTRACT

A display device includes a first subpixel and a second subpixel, wherein the first subpixel includes a first light source unit including a plurality of first light-emitting elements configured to emit first light having a center wavelength of a first wavelength, the second subpixel includes a second light source unit including a plurality of second light-emitting elements configured to emit second light having a center wavelength of a second wavelength, the first light source unit includes first to $n^{th}$ light-emitting groups that are connected in series, each of the groups including the plurality of first light-emitting elements, the second light source unit includes first to $m^{th}$ light-emitting groups that are connected in series and each of the groups includes the plurality of second light-emitting elements, where n and m are natural numbers, and the second wavelength is different from the first wavelength.

16 Claims, 18 Drawing Sheets

(56) References Cited

U.S. PATENT DOCUMENTS

| | | | | |
|---|---|---|---|---|
| 9,622,309 | B2* | 4/2017 | Kang | H05B 45/48 |
| 10,340,419 | B2 | 7/2019 | Kim et al. | |
| 11,749,658 | B2* | 9/2023 | Lee | H01L 33/60 |
| | | | | 257/71 |
| 2014/0048840 | A1 | 2/2014 | Kim et al. | |
| 2017/0041564 | A1 | 2/2017 | Konstantatos et al. | |
| 2020/0123026 | A1* | 4/2020 | Leung | C02F 1/463 |
| 2020/0258938 | A1* | 8/2020 | Chai | H01L 33/62 |
| 2022/0393086 | A1* | 12/2022 | Tae | H01L 25/0753 |

FOREIGN PATENT DOCUMENTS

| | | |
|---|---|---|
| KR | 10-1436123 B1 | 11/2014 |
| KR | 2018-0009014 A | 1/2018 |
| KR | 10-1978485 B1 | 5/2019 |
| KR | 2020-0010701 A | 1/2020 |
| KR | 10-2020-0088954 A | 7/2020 |
| KR | 10-2020-0097869 A | 8/2020 |
| KR | 10-2020-0130606 A | 11/2020 |

OTHER PUBLICATIONS

Written Opinion dated dated Mar. 14, 2022 for corresponding PCT Application No. PCT/KR2021/017829 (4 pages).

\* cited by examiner

DISPLAY DEVICE

CROSS-REFERENCE TO RELATED APPLICATION

This application claims priority to and the benefit of Korean Patent Application No. 10-2020-0163674, filed on Nov. 30, 2020 in the Korean Intellectual Property Office, the disclosure of which is incorporated herein by reference in its entirety.

BACKGROUND

1. Field

The present disclosure relates to a display device.

2. Description of the Related Art

The importance of display devices is increasing along with the development of multimedia. Accordingly, various types of display devices, such as organic light-emitting diode (OLED) displays and liquid crystal displays (LCDs), are being used.

Display devices are devices that display an image and include a display panel such as an organic light-emitting display panel or a liquid crystal display panel. Among these, the display device may include light-emitting elements in a light-emitting display panel. For example, a light-emitting diode (LED) may include an OLED that uses an organic material as a light-emitting material, an inorganic light-emitting diode that uses an inorganic material as a light-emitting material, or the like.

SUMMARY

Aspects of embodiments of the present disclosure provide a display device in which the number of series connections is made different according to light-emitting elements included in subpixels, thereby reducing or minimizing loss that may occur due to a difference in operating voltage between the light-emitting elements.

It should be noted that the aspects and features of embodiments of the present disclosure are not limited to the above-described aspects and features, and other aspects and features of the present disclosure will be apparent to those skilled in the art from the following descriptions.

According to one embodiment of the present disclosure, a display device includes a first subpixel and a second subpixel, wherein the first subpixel includes a first light source unit including a plurality of first light-emitting elements configured to emit first light having a center wavelength of a first wavelength, wherein the second subpixel includes a second light source unit including a plurality of second light-emitting elements configured to emit second light having a center wavelength of a second wavelength, wherein the first light source unit includes first to $n^{th}$ light-emitting groups that are connected in series, each of the first to $n^{th}$ light-emitting groups including the plurality of first light-emitting elements, where n is a natural number, wherein the second light source unit includes first to $m^{th}$ light-emitting groups that are connected in series, each of the first to $m^{th}$ light-emitting groups including the plurality of second light-emitting elements, where m is a natural number, wherein the second wavelength is different from the first wavelength, and n is different from m.

In an embodiment, the second wavelength is longer than the first wavelength, and m is greater than n.

In an embodiment, the first wavelength ranges from about 450 nm to about 495 nm or ranges from about 520 nm to about 575 nm, and the second wavelength ranges from about 600 nm to about 750 nm.

In an embodiment, n is two, and m is three.

In an embodiment, n is three, and m is four.

In an embodiment, the display device includes a third subpixel, wherein the third subpixel includes a third light source unit including a plurality of third light-emitting elements configured to emit third light having a center wavelength of a third wavelength, wherein the third light source unit includes first to $s^{th}$ light-emitting groups that are connected in series, each of the first to $s^{th}$ light-emitting groups including the plurality of third light-emitting elements, where s is a natural number, wherein the third wavelength is different from the second wavelength, and s is different from the m.

In an embodiment, the second wavelength is longer than the third wavelength, and m is greater than s.

In an embodiment, the first wavelength ranges from about 450 nm to about 495 nm, the second wavelength ranges from about 600 nm to about 750 nm, and the third wavelength ranges from about 520 nm to about 575 nm.

In an embodiment, n and s are the same.

In an embodiment, the plurality of first light-emitting elements in each of the first to $n^{th}$ light-emitting groups of the first light source unit are connected in parallel to each other.

In an embodiment, the plurality of second light-emitting elements in each of the first to $m^{th}$ light-emitting groups of the second light source unit are connected in parallel to each other.

In an embodiment, each of the first and second light-emitting elements is an inorganic light-emitting diode.

In an embodiment, the first light source unit further includes a first electrode electrically connected to a first transistor and a second electrode electrically connected to a first voltage line, and wherein the first to $n^{th}$ light-emitting groups of the first light source unit include the first light-emitting group and a second light-emitting group connected in series between the first electrode of the first light source unit and the second electrode of the first light source unit.

In an embodiment, one end of the first light-emitting group of the first light source unit is connected to the first electrode of the first light source unit, wherein an other end of the first light-emitting group of the first light source unit is connected to one end of the second light-emitting group of the first light source unit, and wherein an other end of the second light-emitting group of the first light source unit is connected to the second electrode of the first light source unit.

In an embodiment, the second light source unit further includes a first electrode electrically connected to the first transistor and a second electrode electrically connected to the first voltage line, and wherein the first to $m^{th}$ light-emitting groups of the second light source unit include the first light-emitting group, the second light-emitting group, and the third light-emitting group connected in series between the first electrode of the second light source unit and the second electrode of the second light source unit.

In an embodiment, one end of the first light-emitting group of the second light source unit is connected to the first electrode of the second light source unit, wherein an other end of the first light-emitting group of the second light source unit is connected to one end of the second light-emitting group of the second light source unit, wherein an other end of the second light-emitting group of the second light source unit is connected to one end of the third light-emitting group of the second light source unit, wherein an other end of the third light-emitting group of the second light source unit is connected to the second electrode of the second light source unit.

According to another embodiment of the present disclosure, a display device includes a first subpixel and a second subpixel, wherein the first subpixel includes a first light-emitting element configured to emit first light having a center wavelength of a first wavelength, the first light-emitting including a first sub-light-emitting element and a second sub-light-emitting element connected in series and a first contact electrode in contact with at least one end portion of the first light-emitting element and including a first sub-contact electrode, a second sub-contact electrode, and a third sub-contact electrode that are spaced from each other, and the second subpixel includes a second light-emitting element configured to emit second light having a center wavelength of a second wavelength longer than the first wavelength, the second light-emitting element including a first sub-light-emitting element, a second sub-light-emitting element, and a third sub-light-emitting element connected in series and a second contact electrode in contact with at least one end portion of the second light-emitting element and including a first sub-contact electrode, a second sub-contact electrode, a third sub-contact electrode, and a fourth sub-contact electrode that are spaced from each other.

In an embodiment, the first wavelength ranges from about 450 nm to about 495 nm or ranges from about 520 nm to about 575 nm, and the second wavelength ranges from about 600 nm to about 750 nm.

In an embodiment, the first subpixel further includes a first electrode electrically connected to a first transistor and a second electrode electrically connected to a first voltage line, wherein the first sub-contact electrode of the first contact electrode is in contact with each of the first electrode of the first subpixel and one end portion of the first sub-light-emitting element of the first light-emitting element, wherein the second sub-contact electrode of the first contact electrode is in contact with each of an other end portion of the first sub-light-emitting element of the first light-emitting element and one end portion of the second sub-light-emitting element of the first light-emitting element, and wherein the third sub-contact electrode of the first contact electrode is in contact with each of an other end portion of the second sub-light-emitting element of the first light-emitting element and the second electrode of the first subpixel.

In an embodiment, the second subpixel further includes a first electrode electrically connected to the first transistor and a second electrode electrically connected to the first voltage line, wherein the first sub-contact electrode of the second contact electrode is in contact with each of the first electrode of the second subpixel and one end portion of the first sub-light-emitting element of the second light-emitting element, wherein the second sub-contact electrode of the second contact electrode is in contact with each of an other end portion of the first sub-light-emitting element of the second light-emitting element and one end portion of the second sub-light-emitting element of the second light-emitting element, wherein the third sub-contact electrode of the second contact electrode is in contact with each of an other end portion of the second sub-light-emitting element of the second light-emitting element and one end portion of the third sub-light-emitting element of the second light-emitting element, and wherein the fourth sub-contact electrode of the second contact electrode is in contact with each of an other end portion of the third sub-light-emitting element of the second light-emitting element and the second electrode of the second subpixel.

Other details of embodiments of the present disclosure are included in the detailed description and the drawings.

DETAILED DESCRIPTION

Figure 1:
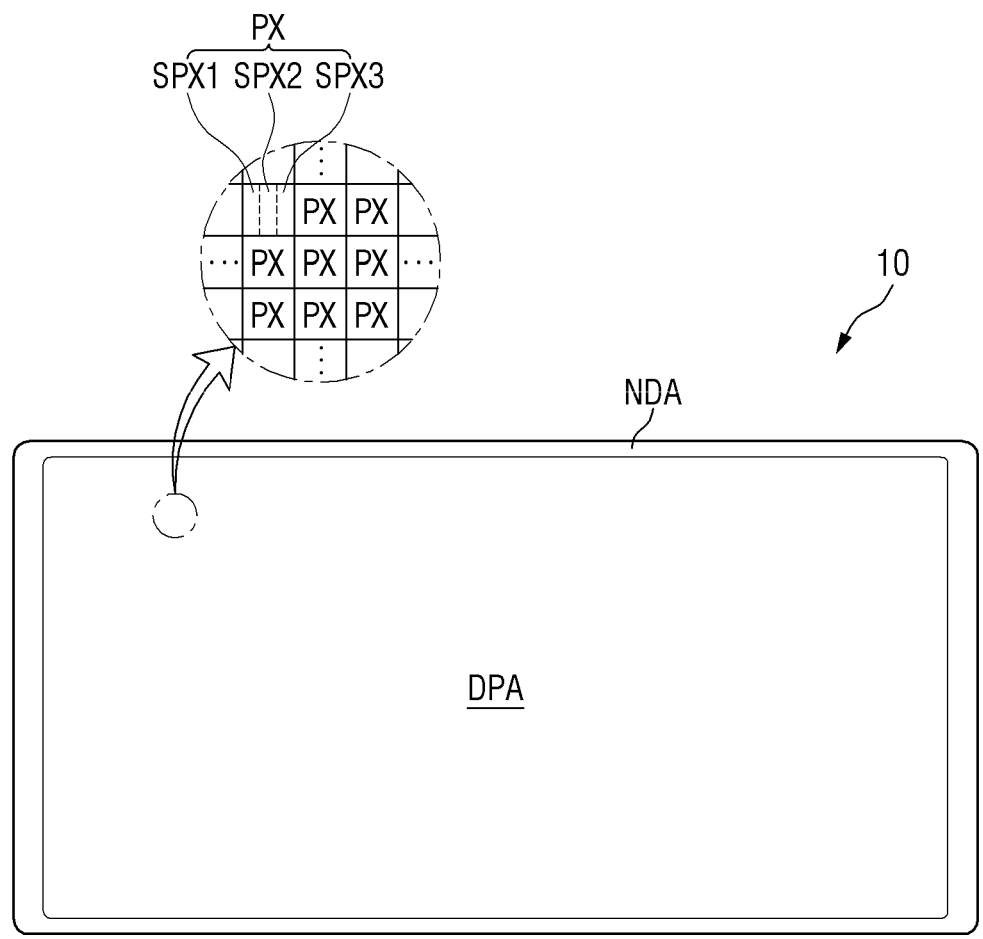
FIG. 1 is a schematic plan view of a display device according to one embodiment.

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, embodiments will be described with reference to the accompanying drawings.

FIG. 1 is a schematic plan view of a display device according to one embodiment.

Referring to FIG. 1, a display device 10 displays a moving image (e.g., a video) or a still image. The display device 10 may refer to any electronic device that provides a display screen. For example, the display device 10 may include a television, a laptop computer, a monitor, a billboard, a device for the Internet of Things (IoTs), a mobile phone, a smartphone, a tablet personal computer (PC), an electronic watch, a smartwatch, a watch phone, a head-mounted display, a mobile communication terminal, an electronic notebook, an e-book reader, a portable multimedia player (PMP), a navigation system, a game console, a digital camera, and a camcorder, which are provided with a display screen.

The display device 10 includes a display panel that provides a display screen. Examples of the display panel may include an inorganic light-emitting diode display panel, an organic light-emitting display panel, a quantum dot light-emitting display panel, a plasma display panel, a field emission display panel, and the like. Hereinafter, although an example in which the inorganic light-emitting diode display panel as the example of the display panel is applied is described, the present disclosure is not limited thereto, and a device to which the same technical spirit is applicable may be applied to other display panels.

Hereinafter, a first direction DR1, a second direction DR2, and a third direction DR3 are defined in drawings of embodiments for describing the display device 10. The first direction DR1 and the second direction DR2 may be directions perpendicular to each other in one plane. The third direction DR3 may be a direction perpendicular to a plane in which the first direction DR1 and the second direction DR2 are positioned. The third direction DR3 is perpendicular to each of the first direction DR1 and the second direction DR2. In embodiments of the display device 10, the third direction DR3 indicates a thickness direction (or a display direction) of the display device 10.

The display device 10 may have a rectangular shape in which a long side thereof in the first direction DR1 is longer than a short side in the second direction DR2 in a plan view. A corner at which the long side and the short side of the display device 10 meet each other may be right angled but is not limited thereto. The corner may have a rounded curved shape. The shape of the display device 10 is not limited to the illustrated one and may be variously modified. For example, the display device 10 may have other shapes such as a square shape, a quadrangular shape with round corners (vertexes), other polygonal shapes, and a circular shape in a plan view.

A display surface of the display device 10 may be disposed at one side of the third direction DR3 which is the thickness direction. In some embodiments, unless otherwise stated, in describing the display device 10, the term "upper" refers to the display direction, that is, one side of the third direction DR3, and similarly, the term "upper surface" refers to a surface that faces the one side of the third direction DR3.

The term "lower" refers to a direction opposite to the display direction, that is, the other side of the third direction DR3, and the term "lower surface" refers to a surface that faces the other side of the third direction DR3. In addition, the terms "left," "right," "upper," and "lower" refer to directions when the display device 10 is viewed in a plan view. For example, the term "right" refers to the first direction DR1, the term "left" refers to a direction opposite to the first direction DR1, the term "upper" refers to the second direction DR2, and the term "lower" refers to a direction opposite to the second direction DR2.

The display device 10 may include a display area DPA and a non-display area NDA surrounding the display area DPA along an edge or periphery of the display area DPA. The display area DPA is an area in which a screen may be displayed, and the non-display area NDA is an area in which a screen is not displayed.

A shape of the display area DPA may follow a shape of the display device 10. For example, the shape of the display area DPA may also be a planar rectangular shape similar to an overall shape of the display device 10. The display area DPA may substantially occupy a center (or a central region) of the display device 10.

The display area DPA may include a plurality of pixels PX. The plurality of pixels PX may be arranged in a matrix direction (e.g., the plurality of pixels PX may be arranged along rows and columns of a matrix). A shape of each pixel PX may be a rectangular shape or a square shape in a plan view. The pixels PX may be alternately arranged as a stripe arrangement structure or a PENTILE® arrangement structure. This pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

However, the present disclosure is not limited thereto. Each pixel PX may include light-emitting elements made of inorganic particles.

Each pixel PX may include a plurality of subpixels SPX: SPX1, SPX2, and SPX3. In one embodiment, each pixel PX may include a first subpixel SPX1, a second subpixel SPX2, and a third subpixel SPX3. The first subpixel SPX1 may represent a first color, the second subpixel SPX2 may represent a second color, and the third subpixel SPX3 may represent a third color. The first color may be a blue color, the second color may be a green color, and the third color may be a red color.

In the drawings, the first to third subpixels SPX1, SPX2, and SPX3 are illustrated as being arranged as the stripe type, but the arrangement of the first to third subpixels SPX1, SPX2, and SPX3 is not limited thereto. The first to third subpixels SPX1, SPX2, and SPX3 may have various arrangement structures.

The non-display area NDA may be disposed around the display area DPA along the edge or periphery of the display area DPA. The non-display area NDA may completely or partially surround the display area DPA. The non-display area NDA may form a bezel of the display device 10.

Figure 2:
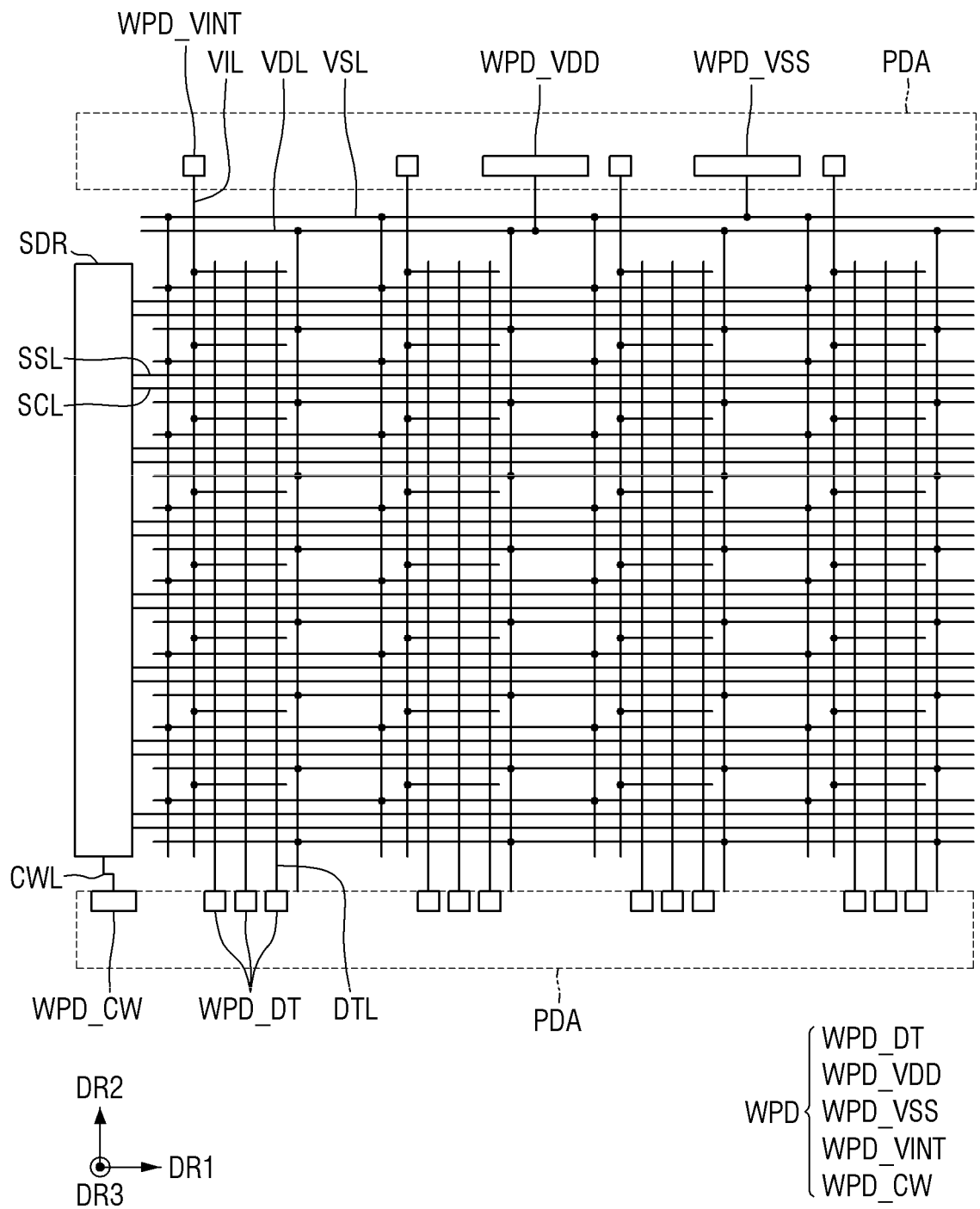
FIG. 2 is a schematic layout illustrating lines included in a display device according to one embodiment.

FIG. 2 is a schematic layout illustrating lines included in a display device according to one embodiment.

Referring to FIG. 2, a display device 10 may include a plurality of lines. The plurality of lines may include a scan line SCL, a sensing line SSL, a data line DTL, an initialization voltage line VIL, a first voltage line VDL, a second voltage line VSL, and the like. In addition, although not shown in the drawings, other lines may be further disposed in the display device 10.

In the present specification, the term "connection" may mean that one member is connected to another member through physical contact as well as that one member is connected to another member through still another member. In addition, it may be understood that one member and another member are integrated into one member and one portion of the integrated member is connected to the other portion of the integrated member. Furthermore, the connection between one member and another member may be interpreted as including an electrical connection through still another member in addition to a connection through a direct contact.

The scan line SCL and the sensing line SSL may extend in a first direction DR1. The scan line SCL and the sensing line SSL may be connected to a scan driver SDR. The scan driver SDR may include a driving circuit. The scan driver SDR may be disposed in a non-display area NDA. In an embodiment, the scan driver SDR may be disposed in the non-display area NDA disposed adjacent to a first short side (left side in FIG. 1) of the display device 10, but the present disclosure is not limited thereto. The scan driver SDR may be connected to the signal connection line CWL, and at least one end portion of the signal connection line CWL may form a line pad WPD_CW in the non-display area NDA to be connected to an external device.

The data line DTL and the initialization voltage line VIL may extend in a second direction DR2 intersecting the first direction DR1. The initialization voltage line VIL may further include a portion extending in the second direction DR2 as well as a portion branched off therefrom in the first direction DR1.

The first voltage line VDL and the second voltage line VSL may extend in the second direction DR2. The first voltage line VDL and the second voltage line VSL may further include portions extending in the first direction DR1. The first voltage line VDL and the second voltage line VSL may have a mesh structure, but the present disclosure is not limited thereto.

In some embodiments, each of the pixels PX of the display device 10 may be connected to at least one data line DTL, the initialization voltage line VIL, the first voltage line VDL, and the second voltage line VSL.

The data line DTL, the initialization voltage line VIL, the first voltage line VDL, and the second voltage line VSL may be electrically connected to at least one line pad WPD. Each line pad WPD may be disposed in a pad area PDA included in the non-display area NDA. The pad area PDA may be disposed in the non-display area NDA disposed adjacent to a first long side (upper side in FIG. 1) of the display device 10 and in the non-display area NDA disposed adjacent to a second long side (lower side in FIG. 1) of the display device 10.

In one embodiment, a line pad WPD_DT (hereinafter, referred to as "data pad") of the data line DTL may be disposed in the pad area PDA positioned at a lower side of the display device 10, a line pad WPD_VINT (hereinafter, referred to as "initialization voltage pad") of the initialization voltage line VIL, a line pad WPD_VDD (hereinafter, referred to as "first voltage pad") of the first voltage line VDL, and a line pad WPD_VSS (hereinafter, referred to as "second voltage pad") of the second voltage line VSL may be disposed in the pad area PDA positioned at an upper side of the display device 10. For another example, the data pad WPD_DT, the initialization voltage pad WPD_VINT, the first voltage pad WPD_VDD, and the second voltage pad WPD_VSS may all be disposed in the same area, i.e., in the pad area PDA positioned at the upper side of the display device 10. The external device may be mounted on the line pad WPD. The external device may be mounted on the line pad WPD through an anisotropic conductive film, ultrasonic bonding, or the like. In addition, while a process of testing whether the display device has a contact defect is performed, a current measurement device of a test device may be electrically connected to the line pad WPD of the display device 10 to measure a current or apply a voltage.

Each pixel PX or each subpixel SPX: SPX1, SPX2, or SPX3 of the display device 10 includes a pixel driving circuit. The above-described lines may apply a driving signal to each pixel driving circuit by passing through or around each pixel PX. The pixel driving circuit may include transistors and capacitors. The number of the transistors and capacitors of each pixel driving circuit may be variously modified. Each subpixel SPX of the display device 10 according to one embodiment may have a 3T1C structure in which the pixel driving circuit includes three transistors and one capacitor. Hereinafter, a pixel driving circuit will be described by taking an example in which the pixel driving circuit included in the display device 10 has a 3T1C structure, but the present disclosure is not limited thereto. Various other modified pixel structures such as a 2T1C structure, a 7T1C structure, and a 6T1C structure may be applied.

Figure 3:
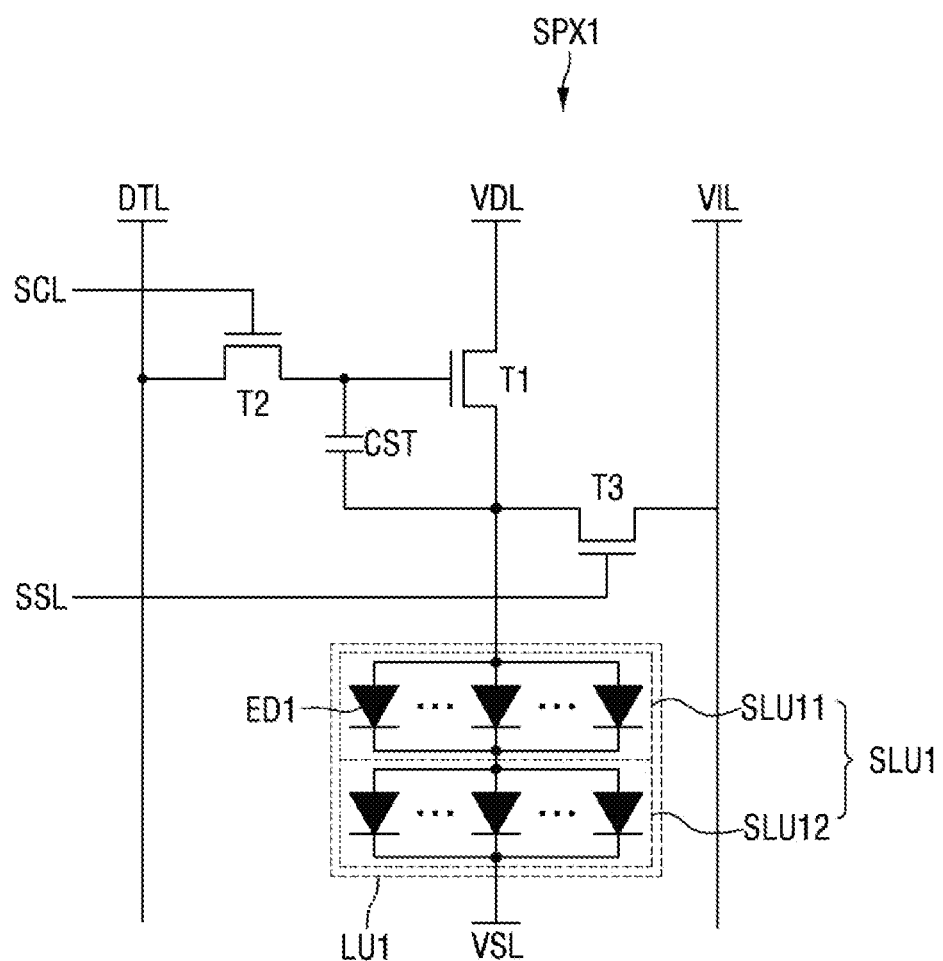
FIG. 3 is an equivalent circuit diagram of a first subpixel of a display device according to one embodiment.
Figure 4:
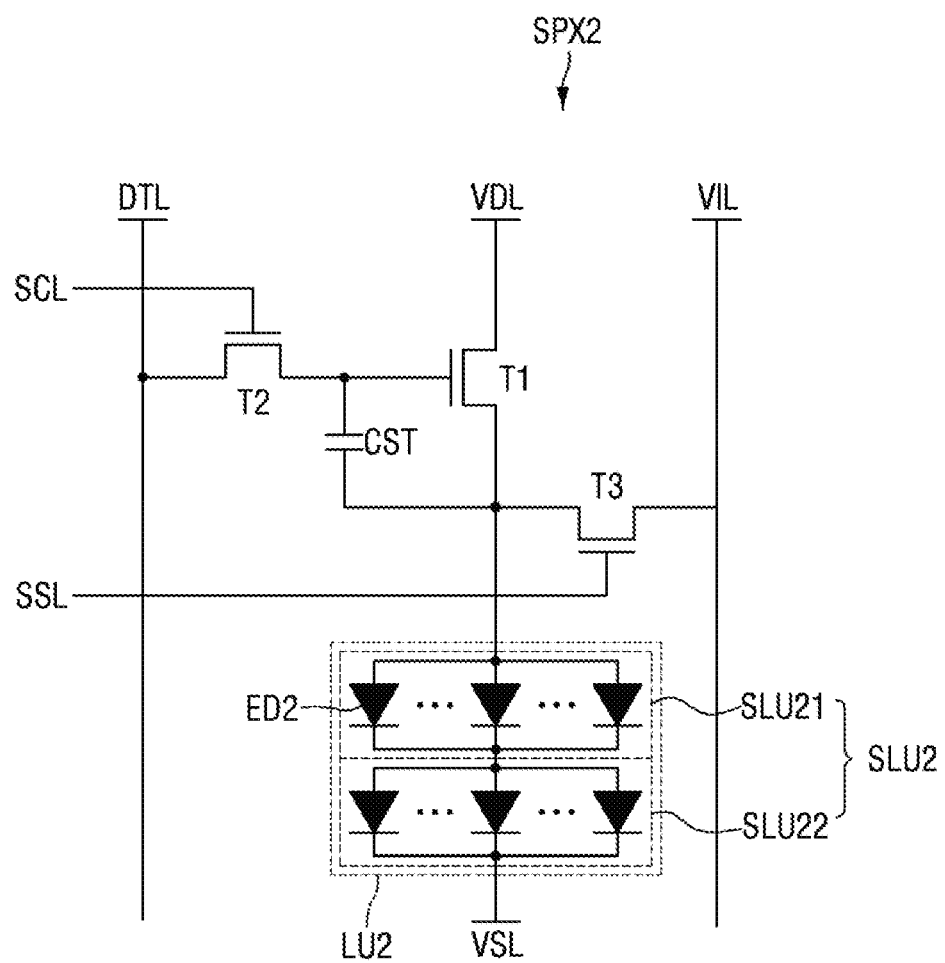
FIG. 4 is an equivalent circuit diagram of a second subpixel of the display device according to one embodiment.
Figure 5:
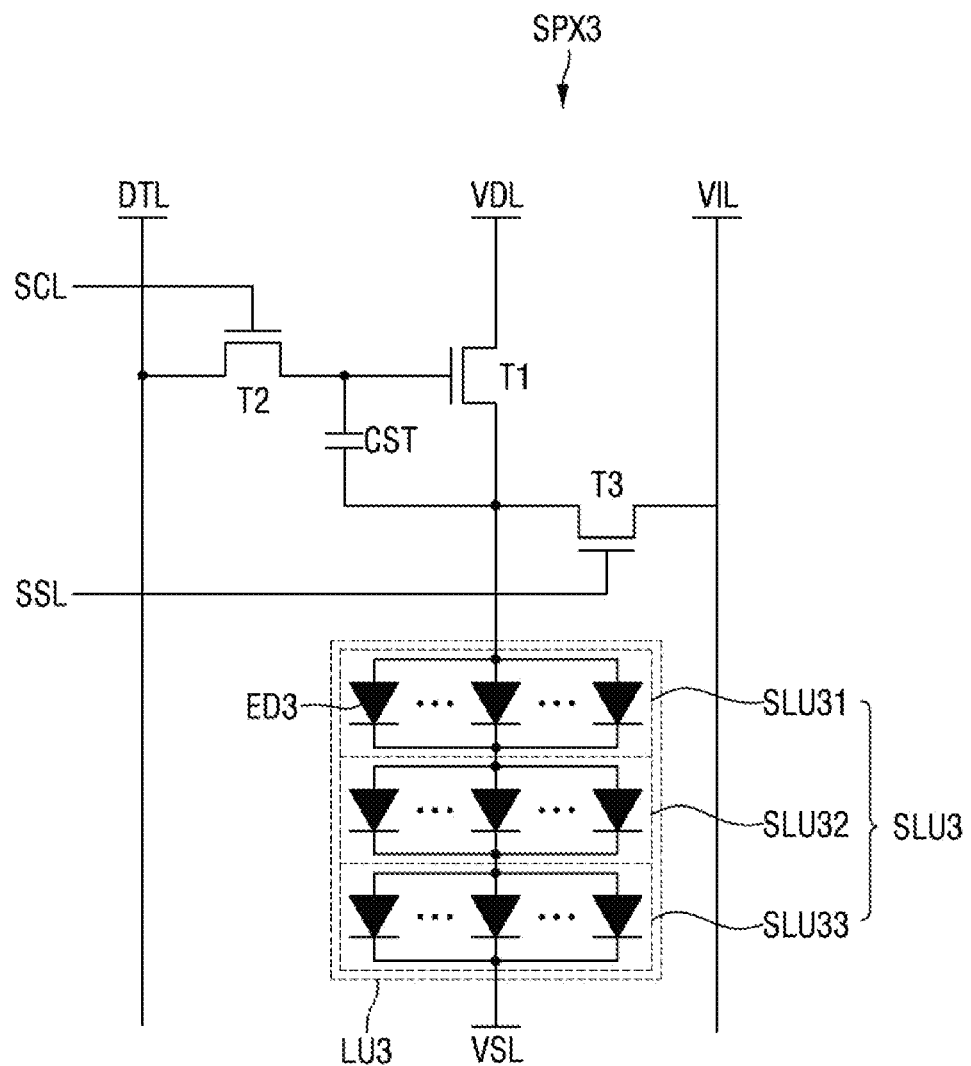
FIG. 5 is an equivalent circuit diagram of a third subpixel of the display device according to one embodiment.

FIG. 3 is an equivalent circuit diagram of a first subpixel of a display device according to one embodiment. FIG. 4 is an equivalent circuit diagram of a second subpixel of the display device according to one embodiment. FIG. 5 is an equivalent circuit diagram of a third subpixel of the display device according to one embodiment.

As described above, first to third subpixels SPX1, SPX2, and SPX3 included in each pixel PX may display different colors. Each subpixel SPX: SPX1, SPX2, or SPX3 may include one or more light-emitting elements that emit light having a specific wavelength. For example, the first subpixel SPX1 may include first light-emitting elements ED1 (see FIG. 3) that emit a first color light, thereby displaying a first color, the second subpixel SPX2 may include second light-emitting elements ED2 (see FIG. 4) that emit a second color light, thereby displaying a second color, and the third subpixel SPX3 may include third light-emitting elements ED3 (see FIG. 5) that emit a third color light, thereby displaying a third color. The first color may be a blue color, the second color may be a green color, and the third color may be a red color. Hereinafter, an example will be described in which the first subpixel SPX1, the second subpixel SPX2, and the third subpixel SPX3 included in one pixel PX of a display device 10 display a blue color, a green color, and a red color, respectively. However, the present disclosure is not limited thereto, and the first and second subpixels SPX1 and SPX2 may display the same color, and the third subpixel SPX3 may display a different color from the first and second subpixels SPX1 and SPX2.

Referring to FIGS. 3-5, the first to third subpixels SPX1, SPX2, and SPX3 may each include a pixel driving circuit having a 3T1C structure that includes three transistors and one capacitor.

Referring to FIG. 3, the first subpixel SPX1 of the display device 10 according to one embodiment may include a first light source unit LU1, a plurality of transistors T1, T2, and T3, and a storage capacitor CST. The plurality of transistors T1, T2, and T3 may include a first transistor T1, a second transistor T2, and a third transistor T3.

The first light source unit LU1 may include the plurality of first light-emitting elements ED1 to emit light according to a current supplied through the first transistor T1 of the first subpixel SPX1. The first light source unit LU1 may include a first electrode, a second electrode, and one or more light-emitting groups SLU1: SLU11 and SLU12 disposed and connected in series therebetween. In an embodiment, the first light source unit LU1 may include two light-emitting groups SLU1: SLU11 and SLU12 connected in series, that is, a first light-emitting group SLU11 and a second light-emitting group SLU12 that are connected in series with each other. However, the present disclosure is not limited thereto, and the first light source unit LU1 may also include one light-emitting group SLU1 and may also include more light-emitting groups SLU1: SLU11 or SLU12 connected in series.

Each light-emitting group SLU1: SLU11 or SLU12 of the first subpixel SPX1 may include one or more first light-emitting elements ED1 connected in parallel. The first light-emitting element ED1 may be a light-emitting element that emits the first color light to be emitted by the first subpixel SPX1. For example, the first light-emitting element ED1 may be a light-emitting element that emits blue light having a center wavelength ranging from about 450 nm to 495 nm.

In the drawings, the plurality of first light-emitting elements ED1 included in each light-emitting group SLU1: SLU11 or SLU12 of the first light source unit LU1 are illustrated as being arranged in the same direction and connected in parallel, but the present disclosure is not limited thereto. For example, among the plurality of first light-emitting elements ED1 included in each light-emitting group SLU1: SLU11 or SLU12, some may be connected so as to be arranged in a direction opposite to others.

One end of the first light source unit LU1 may be connected to a source electrode of the first transistor T1 of the first subpixel SPX1, and the other end thereof may be connected to a second voltage line VSL to which a low potential voltage (hereinafter, referred to as a second power voltage), which is lower than a high potential voltage (hereinafter, referred to as a first power voltage) of a first voltage line VDL, is supplied. For example, one end portion of the first light-emitting element ED1 included in the first light-emitting group SLU11 of the first light source unit LU1 may be connected to the source electrode of the first transistor T1 through the first electrode of the first light source unit LU1, and the other end portion of the first light-emitting element ED1 included in the first light-emitting group SLU11 of the first light source unit LU1 may be connected to one end portion of the first light-emitting element ED1 included in the second light-emitting group SLU12 of the first light source unit LU1. The other end portion of the first light-emitting element ED1 included in the second light-emitting group SLU12 of the first light source unit LU1 may be connected to the second voltage line VSL through the second electrode of the first light source unit LU1.

The first transistor T1 may adjust a current flowing to the first light source unit LU1 from the first voltage line VDL to which the first power voltage is supplied according to a voltage difference between a gate electrode and a source electrode of the first transistor T1. As an example, the first transistor T1 may be a driving transistor for driving the first light source unit LU1. The gate electrode of the first transistor T1 may be connected to a second source/drain electrode of the second transistor T2, the source electrode of the first transistor T1 may be connected to the first electrode of the first light source unit LU1, and a drain electrode of the first transistor T1 may be connected to the first voltage line VDL to which the first power voltage is applied.

The second transistor T2 is turned on in response to a scan signal of a scan line SCL to connect a data line DTL to the gate electrode of the first transistor T1. A gate electrode of the second transistor T2 may be connected to the scan line SCL, the second/source/drain electrode of the second transistor T2 may be connected to the gate electrode of the first transistor T1, and a first source/drain electrode of the second transistor T2 may be connected to the data line DTL.

The third transistor T3 is turned on in response to a sensing signal of a sensing line SSL to connect an initialization voltage line VIL to the source electrode of the first transistor T1. A gate electrode of the third transistor T3 may be connected to the sensing line SSL, a first source/drain electrode of the third transistor T3 may be connected to the initialization voltage line VIL, and a second source/drain electrode of the third transistor T3 may be connected to the source electrode of the first transistor T1.

In one embodiment, the first source/drain electrode of each of the second and third transistors T2 and T3 may be a source electrode, and the second source/drain electrode thereof may be a drain electrode, but the present disclosure is not limited thereto, and vice versa.

The storage capacitor CST is formed or connected between the gate electrode of the first transistor T1 and the source electrode of the first transistor T1. The storage capacitor CST stores a charge corresponding to a voltage difference between a gate voltage and a source voltage of the first transistor T1.

Each of the first to third transistors T1, T2, and T3 may be formed as a thin film transistor (TFT). In FIG. 3, the descriptions have been given based on the first to third transistors T1, T2, and T3 being formed as N-type metal oxide semiconductor field effect transistors (MOSFETs), but the present disclosure is not limited thereto. That is, the first to third transistors T1, T2, and T3 may be formed as P-type MOSFETs, or some of the first to third transistors T1, T2, and T3 may be N-type MOSFETs, and other thereof may be formed as P-type MOSFETs.

Referring to FIG. 4, the second subpixel SPX2 of the display device 10 according to one embodiment may include a second light source unit LU2, a plurality of transistors T1, T2, and T3, and a storage capacitor CST. As in the first subpixel SPX1, the plurality of transistors T1, T2, and T3 of the second subpixel SPX2 may include a first transistor T1, a second transistor T2, and a third transistor T3. In some embodiments, the second subpixel SPX2 of the display device 10 may include a pixel driving circuit having the same structure as that of the first subpixel SPX1 excluding the second light source unit LU2. Hereinafter, the equivalent circuit diagram of the second subpixel SPX2 will be described based on differences from the first subpixel SPX1, and descriptions of the same configuration will be replaced with the descriptions of the first subpixel SPX1 described with reference to FIG. 3.

The second light source unit LU2 may include the plurality of second light-emitting elements ED2 to emit light according to a current supplied through the first transistor T1 of the second subpixel SPX2. The second light source unit LU2 may include a first electrode, a second electrode, and one or more light-emitting groups SLU2: SLU21 and SLU22 disposed and connected in series therebetween. The number of the light-emitting groups SLU2: SLU21 and SLU22 included in the second light source unit LU2 may be the same as the number of the light-emitting groups SLU1: SLU11 and SLU12 included in the first light source unit LU1 of the first subpixel SPX1. In an embodiment, when the first light source unit LU1 includes two light-emitting groups SLU1: SLU11 and SLU12 connected in series, the second light source unit LU2 may include two light-emitting groups SLU2: SLU21 and SLU22 connected in series, that is, a first light-emitting group SLU21 and a second light-emitting group SLU22 that are connected in series with each other. However, the present disclosure is not limited thereto, and the second light source unit LU2 may also include one light-emitting group SLU2 and may also include more light-emitting groups SLU2 connected in series.

Each light-emitting group SLU2: SLU21 or SLU22 of the second subpixel SPX2 may include one or more second light-emitting elements ED2 connected in parallel. The second light-emitting element ED2 may be a light-emitting element that emits the second color light to be emitted by the second subpixel SPX2. For example, the second light-emitting element ED2 may be a light-emitting element that emits green light having a center wavelength ranging from about 520 nm to about 575 nm.

In the drawings, the plurality of second light-emitting elements ED2 included in each light-emitting group SLU2: SLU21 or SLU22 of the second light source unit LU2 are illustrated as being arranged in the same direction and connected in parallel, but the present disclosure is not limited thereto. For example, among the plurality of second light-emitting elements ED2 included in each light-emitting group SLU2: SLU21 or SLU22, some may be connected so as to be arranged in a direction opposite to other.

One end of the second light source unit LU2 may be connected to a source electrode of the first transistor T1 of the second subpixel SPX2, and the other end thereof may be connected to the second voltage line VSL to which the second power voltage is supplied. For example, one end portion of the second light-emitting element ED2 included in the first light-emitting group SLU21 of the second light source unit LU2 may be connected to the source electrode of the first transistor T1 through the first electrode of the second light source unit LU2, and the other end portion of the second light-emitting element ED2 included in the first light-emitting group SLU21 of the second light source unit LU2 may be connected to one end portion of the second light-emitting element ED2 included in the second light-emitting group SLU22 of the second light source unit LU2. The other end portion of the second light-emitting element ED2 included in the second light-emitting group SLU22 of the second light source unit LU2 may be connected to the second voltage line VSL through the second electrode of the second light source unit LU2.

Referring to FIG. 5, the third subpixel SPX3 of the display device 10 according to one embodiment may include a third light source unit LU3, a plurality of transistors T1, T2, and T3, and a storage capacitor CST. As in the first subpixel SPX1 and the second subpixel SPX2, the plurality of transistors T1, T2, and T3 of the third subpixel SPX3 may include a first transistor T1, a second transistor T2, and a third transistor T3. In some embodiments, the third subpixel SPX3 of the display device 10 may include a pixel driving circuit having the same structure as that of the first and second subpixels SPX1 and SPX2 excluding the third light source unit LU3. Hereinafter, the equivalent circuit diagram of the third subpixel SPX3 will be described based on differences from the first subpixel SPX1, and descriptions of the same configuration will be replaced with the descriptions of the first subpixel SPX1 described with reference to FIG. 3.

The third light source unit LU3 may include the plurality of third light-emitting elements ED3 to emit light according to a current supplied through the first transistor T1 of the third subpixel SPX3. The third light source unit LU3 may include a first electrode, a second electrode, and one or more light-emitting groups SLU3: SLU31, SLU32, and SLU33 disposed and connected in series therebetween. The number of the light-emitting groups SLU3: SLU31, SLU32, and SLU33 included in the third light source unit LU3 may be different from the number of the light-emitting groups SLU1: SLU11 and SLU12 included in the first light source unit LU1 of the first subpixel SPX1 and/or the number of the light-emitting groups SLU2: SLU21 and SLU22 included in the second light source unit LU2 of the second subpixel SPX2. The number of the light-emitting groups SLU3: SLU31, SLU32, and SLU33 included in the third light source unit LU3 may be greater than the number of the light-emitting groups SLU1: SLU11 and SLU12 included in the first light source unit LU1 of the first subpixel SPX1 and/or the number of the light-emitting groups SLU2: SLU21 and SLU22 included in the second light source unit LU2 of the second subpixel SPX2. In an embodiment, when the first light source unit LU1 includes two light-emitting groups SLU1: SLU11 and SLU12 connected in series, the third light source unit LU3 may include three light-emitting groups SLU3: SLU31, SLU32, and SLU33 connected in series, that is, a first light-emitting group SLU31, a second light-emitting group SLU32, and a third light-emitting group SLU33 that are connected to each other in series.

Each light-emitting group SLU3: SLU31, SLU32, or SLU33 of the third subpixel SPX3 may include one or more third light-emitting elements ED3 connected in parallel. The third light-emitting element ED3 may be a light-emitting element that emits the third color light to be emitted by the third subpixel SPX3. For example, the third light-emitting element ED3 may be a light-emitting element that emits red light having a center wavelength ranging from about 600 nm to about 750 nm.

In the drawings, the plurality of third light-emitting elements ED3 included in each light-emitting group SLU3: SLU31, SLU32, or SLU33 of the third light source unit LU3 are illustrated as being arranged in the same direction and connected in parallel, but the present disclosure is not limited thereto. For example, among the plurality of third light-emitting element ED3 included in each light-emitting group SLU3: SLU31, SLU32, or SLU33, some may be connected so as to be arranged in a direction opposite to other.

One end of the third light source unit LU3 may be connected to a source electrode of the first transistor T1 of the third subpixel SPX3, and the other end thereof may be connected to the second voltage line VSL to which the second power voltage is supplied. For example, one end portion of the third light-emitting element ED3 included in the first light-emitting group SLU31 of the third light source unit LU3 may be connected to the source electrode of the first transistor T1 through the first electrode of the third light source unit LU3, and the other end portion of the third light-emitting element ED3 included in the first light-emitting group SLU31 of the third light source unit LU3 may be connected to one end portion of the third light-emitting element ED3 included in the second light-emitting group SLU32 of the third light source unit LU3. The other end portion of the third light-emitting element ED3 included in the second light-emitting group SLU32 of the third light source unit LU3 may be connected to one end portion of the third light-emitting element ED3 included in the third light-emitting group SLU33 of the third light source unit LU3. The other end portion of the third light-emitting element ED3 included in the third light-emitting group SLU33 of the third light source unit LU3 may be connected to the second voltage line VSL through the second electrode of the third light source unit LU3.

Referring to FIGS. 3-5, the first to third subpixels SPX1, SPX2, and SPX3 may include the same pixel driving circuit, the first and second light source units LU1 and LU2 may respectively include the light-emitting groups SLU1: SLU11 and SLU12 and SLU2: SLU21 and SLU22 that are connected in series in the same number, and the third light source unit LU3 may include the light-emitting groups SLU3: SLU31, SLU32, and SLU33 connected in series in a different number from that of the first and second light source units LU1 and LU2. For example, the number of the light-emitting groups SLU3: SLU31, SLU32, and SLU33 connected in series included in the third light source unit LU3 may be greater than the number of the light-emitting groups SLU1: SLU11 and SLU12 and SLU2: SLU12 and SLU22 connected in series respectively included in the first and second light source units LU1 and LU2. That is, the number of series connections between the plurality of light-emitting groups SLU3: SLU31, SLU32, and SLU33 of the third subpixel SPX3 that represent a red color by including the third light-emitting element ED3 emitting red light may be greater than the number of series connections between the plurality of light-emitting groups SLU1: SLU11 and SLU12 of the first subpixel SPX1 that represents a blue color by including the first light-emitting element ED1 emitting blue light and the number of series connections between the plurality of light-emitting groups SLU2: SLU12 and SLU22 of the second subpixel SPX2 that represents a green color by including the second light-emitting element ED2 emitting green light.

Figure 6:
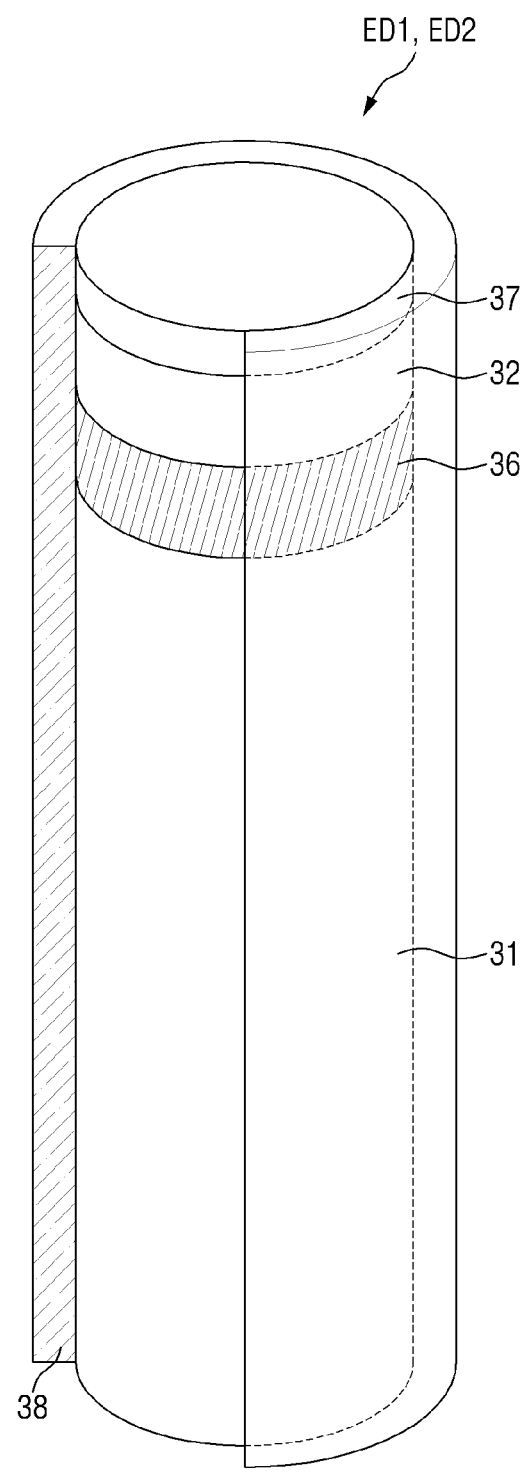
FIG. 6 is a schematic perspective cutaway view of first and second light-emitting elements according to one embodiment.
Figure 7:
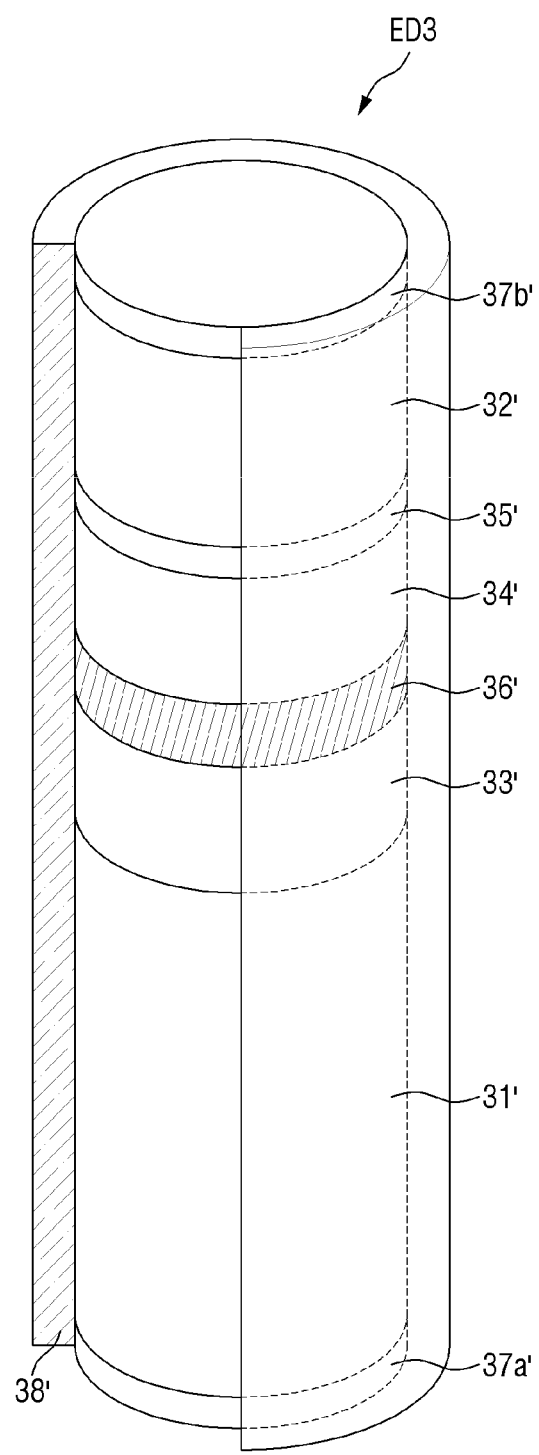
FIG. 7 is a schematic perspective cutaway view of a third light-emitting element according to one embodiment.

FIG. 6 is a schematic perspective cutaway view of first and second light-emitting elements according to one embodiment. FIG. 7 is a schematic perspective cutaway view of a third light-emitting element according to one embodiment.

Referring to FIGS. 6 and 7, light-emitting elements ED: ED1, ED2, and ED3 are discrete elements and may have a rod-like or cylindrical shape having a desired aspect ratio (e.g., a set or predetermined aspect ratio). A length of the light-emitting element ED may be greater than a diameter of the light-emitting element ED, and an aspect ratio thereof may be in a range of 1.2:1 to 100:1, but the present disclosure is not limited thereto.

The light-emitting element ED may have a size ranging from a nanometer scale (1 nm or more and less than 1 um) to a micrometer scale (1 um or more and less than 1 mm). In one embodiment, both of the diameter and length of the light-emitting element ED may have a size of a nanometer scale or a size of a micrometer scale. In some other embodiments, the diameter of the light-emitting element ED may have a size in a nanometer scale, and the length of the light-emitting element ED may have a size in a micrometer scale. In some embodiments, the diameter and/or size of some light-emitting elements ED may be in a nanometer scale, and the diameter and/or size of other light-emitting elements ED may be in a micrometer scale.

The light-emitting element ED may include an inorganic light-emitting diode. The inorganic light-emitting diode may include a plurality of semiconductor layers. For example, the inorganic light-emitting diode may include a first conductivity-type (e.g., an n-type) semiconductor layer, a second conductivity type (e.g., a p-type) semiconductor layer, and an active semiconductor layer interposed therebetween. The active semiconductor layer receives holes and electrons from the first conductivity-type semiconductor layer and the second conductivity-type semiconductor layer, respectively, and the holes and electrons reaching the active semiconductor layer may be combined to emit light.

The first and second light-emitting elements ED1 and ED2 of FIG. 6 may include a light-emitting layer 36 including nitrogen (N) to emit blue light or green light. On the other hand, in the third light-emitting element ED3 of FIG. 7, a light-emitting layer 36' and other semiconductor layers to be described below may each at least include phosphorus (P) to emit red light.

Referring to FIG. 6, the first and second light-emitting elements ED1 and ED2 may include a structure in which the plurality of semiconductor layers described above are sequentially stacked along a length direction of the first and second light-emitting elements ED1 and ED2. As shown in FIG. 6, the first and second light-emitting elements ED1 and ED2 may each include a first semiconductor layer 31, the light-emitting layer 36, and a second semiconductor layer 32 that are sequentially stacked in the length direction. The first semiconductor layer 31, the light-emitting layer 36, and the second semiconductor layer 32 may respectively be the first conductivity-type semiconductor layer, the active semiconductor layer, and the second conductivity-type semiconductor layer described above.

The first semiconductor layer 31 may be doped with a first conductivity-type dopant. When the first and second light-emitting elements ED1 and ED2 emit light having a blue or green wavelength, the first semiconductor layer 31 may include a semiconductor material having a composition ratio of $Al_xGa_yIn_{(1-x-y)}N$ (wherein 0≤x≤1, 0≤y≤1, and 0≤x+y≤1). For example, the semiconductor material may be at least one selected from among AlGaInN, GaN, AlGaN, InGaN, AlN, and InN that are n-type doped. The first conductivity-type dopant may be silicon (Si), germanium (Ge), tin (Sn), or the like. In an embodiment, the first semiconductor layer 31 may include n-GaN doped with n-type Si.

The second semiconductor layer 32 may be disposed to be spaced from the first semiconductor layer 31 with the light-emitting layer 36 interposed therebetween. When the first and second light-emitting elements ED1 and ED2 emit light having a blue or green wavelength, the second semiconductor layer 32 may include a semiconductor material having a composition ratio of $Al_xGa_yIn_{(1-x-y)}N$ (wherein 0≤x≤1, 0≤y≤1, and 0≤x+y≤1). The second semiconductor layer 32 may be doped with a second conductivity-type dopant such as magnesium (Mg), zinc (Zn), calcium (Ca), selenium (Se), barium (Ba), or the like. In an embodiment, the second semiconductor layer 32 may include p-GaN doped with p-type Mg.

The light-emitting layer 36 may be disposed between the first semiconductor layer 31 and the second semiconductor layer 32. The light-emitting layer 36 may include a material having a single or multi-quantum well structure. As described above, the light-emitting layer 36 may emit light due to electron-hole pair recombination according to an electrical signal applied through the first semiconductor layer 31 and the second semiconductor layer 32.

In some embodiments, the light-emitting layer 36 may have a structure in which a semiconductor material having high band gap energy and a semiconductor material having low band gap energy are alternately stacked or may include other Group III or V semiconductor materials according to a wavelength of emitted light.

The first light-emitting element ED1 may emit first color light, i.e., blue light. When the first light-emitting element ED1 emits light having a blue wavelength, the light-emitting layer 36 of the first light-emitting element ED1 may include a material such as AlGaN or AlGaInN. For example, the light-emitting layer 36 of the first light-emitting element ED1 may include AlGaInN as a quantum layer and AlInN as a well layer. Thus, as described above, the light-emitting layer 36 of the first light-emitting element ED1 may emit blue light having a center wavelength ranging from about 450 nm to about 495 nm.

The second light-emitting element ED2 may emit second color light, i.e., green light. When the second light-emitting element ED2 emits light having a green wavelength, the light-emitting layer 36 of the second light-emitting element ED2 may include a material such as AlGaN or AlGaInN. For example, the light-emitting layer 36 of the second light-emitting element ED2 may emit green light having a center wavelength ranging from about 520 nm to about 575 nm.

Light emitted from the light-emitting layer 36 may be emitted not only to an outer surface of the light-emitting element ED: ED1 or ED2 in the length direction thereof but also to both side surfaces of the light-emitting element ED. That is, an emission direction of the light emitted from the light-emitting layer 36 is not limited to one direction.

The light-emitting elements ED: ED1 and ED2 may each further include an electrode layer 37 disposed on the second semiconductor layer 32. The electrode layer 37 may be in contact with the second semiconductor layer 32. The electrode layer 37 may be an ohmic contact electrode. However, the present disclosure is not limited thereto, and the electrode layer 37 may be a Schottky contact electrode.

When both end portions of the light-emitting elements ED: ED1 and ED2 are electrically connected to electrodes or contact electrodes so as to apply electrical signals to the first semiconductor layer 31 and the second semiconductor layer 32, the electrode layer 37 may be disposed between the second semiconductor layer 32 and the electrodes to reduce resistance. The electrode layer 37 may include at least one selected from among aluminum (Al), titanium (Ti), indium (In), gold (Au), silver (Ag), indium tin oxide (ITO), indium zinc oxide (IZO), and indium tin-zinc oxide (ITZO). The electrode layer 37 may include an n-type or p-type-doped semiconductor material.

The light-emitting elements ED: ED1 and ED2 may each further include an insulating film 38 surrounding outer surfaces (e.g., the outer peripheral surfaces or the outer circumferential surfaces) of the first semiconductor layer 31, the second semiconductor layer 32, the light-emitting layer 36, and/or the electrode layer 37. The insulating film 38 may be disposed to surround at least an outer surface of the light-emitting layer 36 and may extend in one direction in which the light-emitting elements ED1 and ED2 extend. The insulating film 38 may perform a function of protecting such members. The insulating film 38 may be made of materials having insulating properties to prevent an electrical short circuit that may occur when the light-emitting layer 36 is in direct contact with an electrode through which an electrical signal is transmitted to the light-emitting elements ED: ED1 and ED2. In addition, because the insulating film 38 protects the outer surfaces (e.g., the outer peripheral surfaces or the outer circumferential surfaces) of the first and second semiconductor layers 31 and 32 including the light-emitting layer 36, it is possible to prevent a decrease in luminous efficiency.

Referring to FIG. 7, the third light-emitting element ED3 according to one embodiment may further include a third semiconductor layer 33' which is disposed between a first semiconductor layer 31' and the light-emitting layer 36', and a fourth semiconductor layer 34' and a fifth semiconductor layer 35' that are sequentially disposed between the light-emitting layer 36' and a second semiconductor layer 32'. The third light-emitting element ED3 is different from the first and second light-emitting elements ED1 and ED2 of FIG. 6 in that the plurality of semiconductor layers 33', 34', and 35' and a plurality of electrode layers 37a' and 37b' are further disposed and the light-emitting layer 36' includes a different element. Hereinafter, repetitive descriptions will be omitted, and differences will be mainly described.

The first and second light-emitting elements ED1 and ED2 shown in FIG. 6 may include the light-emitting layer 36 including nitrogen (N) to emit blue light or green light. On the other hand, in the third light-emitting element ED3, the light-emitting layer 36' and other semiconductor layers included in the third light-emitting element ED3 may each include a semiconductor at least including phosphorus (P). The third light-emitting element ED3 according to one embodiment may emit red light having a center wavelength ranging from about 600 nm to about 750 nm. However, it should be understood that the center wavelength of the red light is not limited to the above range and includes any wavelength range that can be perceived as red in the art.

For example, the first semiconductor layer 31' may be an n-type semiconductor layer and may include a semiconductor material having a composition ratio of $In_xAl_yGa_{(1-x-y)}P$ (wherein $0 \leq x \leq 1$, $0 \leq y \leq 1$, and $0 \leq x+y \leq 1$). The first semiconductor layer 31' may include at least one selected from among InAlGaP, GaP, AlGaP, InGaP, AlP, and InP that are n-type doped. For example, the first semiconductor layer 31' may include n-AlGaInP doped with n-type Si.

The second semiconductor layer 32' may be a p-type semiconductor layer and may include a semiconductor material having a composition ratio of $In_xAl_yGa_{(1-x-y)}P$ (wherein $0 \leq x \leq 1$, $0 \leq y \leq 1$, and $0 \leq x+y \leq 1$). The second semiconductor layer 32' may include at least one selected from among InAlGaP, GaP, AlGaP, InGaP, AlP, and InP that are p-type doped. For example, the second semiconductor layer 32' may include p-GaP doped with p-type Mg.

The third light-emitting element ED3 may emit third color light, i.e., red light. When the third light-emitting element ED3 emits light having a red wavelength, the light-emitting layer 36' of the third light-emitting element ED3 may include a material having a single or multi-quantum well structure. When the light-emitting layer 36' has a structure in which quantum layers and well layers are alternately stacked in a multi-quantum well structure, the quantum layer may include a material such as AlGaP or AlInGaP, and the well layer may include a material such as GaP or AlInP. For example, the light-emitting layer 36' of the third light-emitting element ED3 may include AlGaInP as the quantum layer and AlInP as the well layer. Thus, as described above, the light-emitting layer 36' of the third light-emitting element ED3 may emit red light having a center wavelength ranging from about 600 nm to about 750 nm.

The third light-emitting element ED3 may include clad layers disposed adjacent to the light-emitting layer 36'. As shown in FIG. 7, the third semiconductor layer 33' and the fourth semiconductor layer 34', which are respectively disposed between the light-emitting layer 36' and the first semiconductor layer 31' and between the light-emitting layer 36' and the second semiconductor layer 32' below and on the light-emitting layer 36', may be the clad layers.

The third semiconductor layer 33' may be disposed between the first semiconductor layer 31' and the light-emitting layer 36'. The third semiconductor layer 33' may be an n-type semiconductor layer like the first semiconductor layer 31' and may include a semiconductor material having a composition ratio of $In_xAl_yGa_{(1-x-y)}P$ (wherein $0 \leq x \leq 1$, $0 \leq y \leq 1$, and $0 \leq x+y \leq 1$). For example, the first semiconductor layer 31' may include n-AlGaInP, and the third semiconductor layer 33' may include n-AlInP. However, the present disclosure is not limited thereto.

The fourth semiconductor layer 34' may be disposed between the light-emitting layer 36' and the second semiconductor layer 32'. The fourth semiconductor layer 34' may be a p-type semiconductor layer like the second semiconductor layer 32' and may include a semiconductor material having a composition ratio of $In_xAl_yGa_{(1-x-y)}P$ (wherein $0 \leq x \leq 1$, $0 \leq y \leq 1$, and $0 \leq x+y \leq 1$). For example, the second semiconductor layer 32' may include p-GaP, and the fourth semiconductor layer 34' may include p-AlInP.

The fifth semiconductor layer 35' may be disposed between the fourth semiconductor layer 34' and the second semiconductor layer 32'. The fifth semiconductor layer 35' may include a p-type-doped semiconductor like the second semiconductor layer 32' and the fourth semiconductor layer 34'. In some embodiments, the fifth semiconductor layer 35' may perform a function of reducing a difference in a lattice constant between the fourth semiconductor layer 34' and the second semiconductor layer 32'. The fifth semiconductor layer 35' may be a tensile strain barrier reducing (TSBR) layer. For example, the fifth semiconductor layer 35' may include p-GaInP, p-AlInP, p-AlGaInP, or the like, but the present disclosure is not limited thereto.

A first electrode layer 37a' and a second electrode layer 37b' may be disposed on the first semiconductor layer 31' and the second semiconductor layer 32', respectively. The first electrode layer 37a' may be disposed on a lower surface of the first semiconductor layer 31', and the second electrode layer 37b' may be disposed on an upper surface of the second semiconductor layer 32'. However, the present disclosure is not limited thereto, and at least one of the first electrode layer 37a' and the second electrode layer 37b' may be omitted. For example, in the third light-emitting element ED3, the first electrode layer 37a' may not be disposed on the lower surface of the first semiconductor layer 31', and only one second electrode layer 37b' is disposed on the upper surface of the second semiconductor layer 32'.

Figure 8:
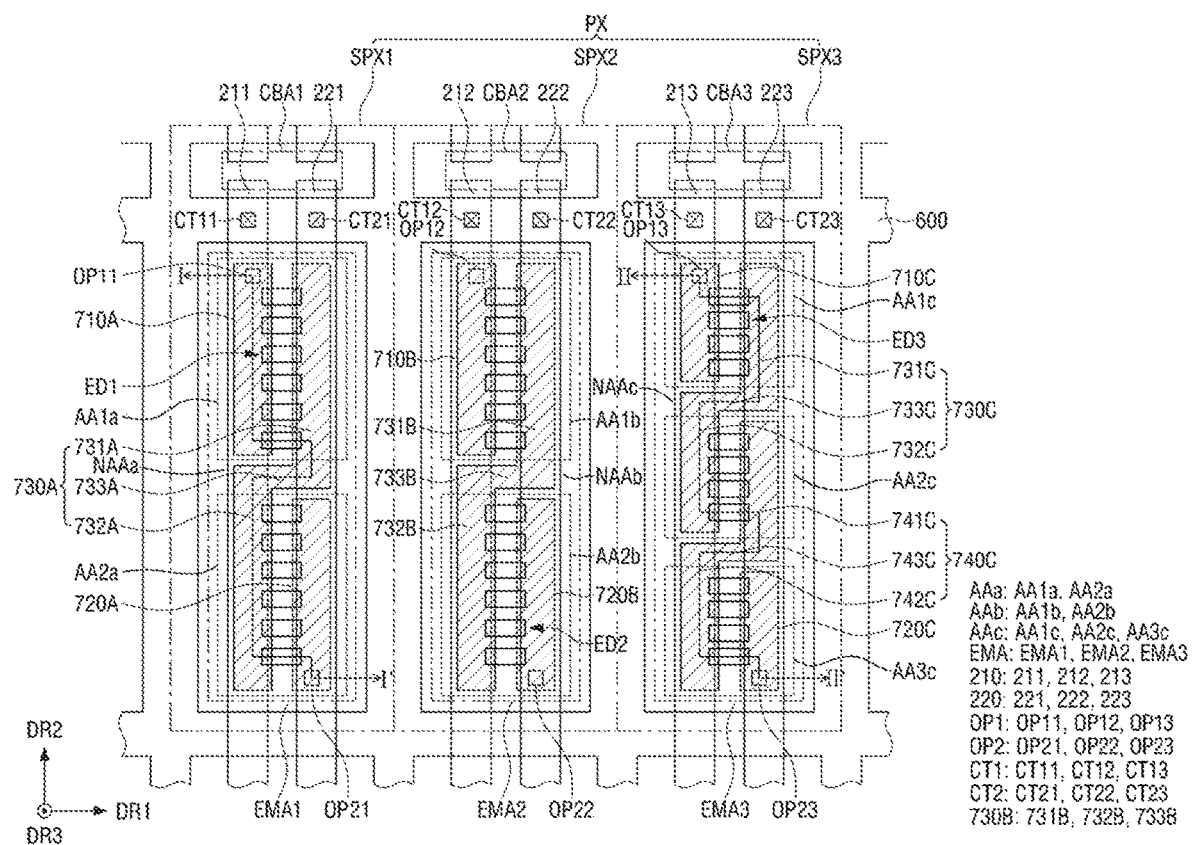
FIG. 8 is a schematic plan layout of one pixel of a display device according to one embodiment.

FIG. 8 is a schematic plan layout of one pixel of a display device according to one embodiment.

Referring to FIG. 8, subpixels SPX: SPX1, SPX2, and SPX3 of a display device 10 may include emission areas EMA: EMA1, EMA2, and EMA3 and non-emitting areas. The emission area EMA may be an area in which light having a specific wavelength, which is emitted from light-emitting elements ED, is emitted, and the non-emission area may be an area in which light is not emitted. The non-emission areas of the subpixels SPX: SPX1, SPX2, and SPX3 may include first to third areas CBA: CBA1, CBA2, and CBA3, respectively. The first to third areas CBA: CBA1, CBA2, and CBA3 may be referred to as first to third cutout areas CBA: CBA1, CBA2, and CBA3, respectively. For example, a first subpixel SPX1 may include a first emission area EMA1, a second subpixel SPX2 may include a second emission area EMA2, and a third subpixel SPX3 may include a third emission area EMA3. In addition, the non-emission areas of the first to third subpixels SPX1, SPX2, and SPX3 may include the first to third areas CBA: CBA1, CBA2, and CBA3 (or first to third cutout areas) disposed above the first to third emission areas EMA1, EMA2, and EMA3, respectively.

Each of the emission areas EMA: EMA1, EMA2, and EMA3 may be disposed at a central portion of each of the subpixels SPX: SPX1, SPX2, and SPX3 in a plan view. The first to third subpixels SPX1, SPX2, and SPX3 of the display device 10 may include first to third light-emitting elements ED1, ED2, and ED3, respectively, and the first to third emission areas EMA1, EMA2, and EMA3 may respectively include areas in which the first to third light-emitting elements ED1, ED2, and ED3 are disposed and may respectively include areas adjacent to the first to third light-emitting elements ED1, ED2, and ED3, i.e., areas in which light beams emitted from the first to third light-emitting elements ED1, ED2, and ED3 are emitted. The first to third emission areas EMA1, EMA2, and EMA3 may further include areas in which the light beams emitted from the first to third light-emitting elements ED1, ED2, and ED3 are reflected or refracted by other members and emitted in a display direction DR3 of the display device 10. That is, the plurality of first to third light-emitting elements ED1, ED2, and ED3 may be disposed in the first to third subpixels SPX1, SPX2, SPX3, respectively, and the areas in which the first to third light-emitting elements ED1, ED2, and ED3 are disposed and areas adjacent to the areas in which the first to third light-emitting elements ED1, ED2, and ED3 are disposed may be combined to form the emission areas EMA: EMA1, EMA2, and EMA3.

The first subpixel SPX1 may include the first emission area EMA1 and the non-emission area. The non-emission area may include the first area CBA1 in which a first electrode 211 and a second electrode 221 disposed in the first subpixel SPX1 are separated. The first area CBA1 may be referred to as the first cutout area CBA1.

The first emission area EMA1 may include a first alignment area AAa and a first non-alignment area NAAa. The first alignment area AAa may include a plurality of sub-alignment areas AAa: AA1a and AA2a spaced from each other in the second direction DR2, and the first non-alignment area NAAa may be disposed to surround the first alignment area AAa. That is, the first non-alignment area NAAa may be an area other than the first alignment area AAa in the first emission area EMA1.

The first alignment area AAa may be an area in which the first light-emitting elements ED1 are intensively disposed, and the first non-alignment area NAAa may be an area in which an arrangement distribution of the first light-emitting element ED1 is relatively low. Because light emitted from the first light-emitting element ED1 disposed in the first alignment area AAa also reaches the first non-alignment area NAAa including the first alignment area AAa, the first emission area EMA1 may include the first alignment area AAa and the first non-alignment area NAAa.

The first alignment area AAa and the first non-alignment area NAAa may be areas distinguished according to the number, distribution, density, and the like of the first light-emitting elements ED1 disposed per unit area. The shapes or positions of the first alignment area AAa and the first non-alignment area NAAa may be related to the shape or arrangement of a first contact electrode including a plurality of sub-contact electrodes 710A, 720A, and 730A and first banks 410 and 420 (e.g., see FIG. 9) to be described below, which are disposed in the first subpixel SPX1.

The first alignment area AAa may include the plurality of sub-alignment areas AA1a and AA2a spaced from each other. The plurality of sub-alignment areas AA1a and AA2a may be spaced from each other in a second direction DR2 in the first emission area EMA1.

The first alignment area AAa may include a first sub-alignment area AA1a and a second sub-alignment area AA2a. The first sub-alignment area AA1a and the second sub-alignment area AA2a may be arranged along the second direction DR2. The first sub-alignment area AA1a and the second sub-alignment area AA2a may be disposed to be spaced from each other.

The first light-emitting elements ED1 disposed in the first sub-alignment area AA1a and the second sub-alignment area AA2a of the first alignment area AAa spaced from each other may be connected in series. For example, the first light-emitting element ED1 disposed in the first sub-alignment area AA1a of the first alignment area AAa may be connected in series with the first light-emitting element ED1 disposed in the second sub-alignment area AA2a of the first alignment area AAa. The present disclosure is not limited thereto, and the plurality of first light-emitting elements ED1 disposed in the same sub-alignment area AA1a or AA2a may be connected in parallel, and the first light-emitting elements ED1 disposed in the sub-alignment areas AA1a and AA2a adjacent to each other may be connected in series.

The first light-emitting element ED1 disposed in the first sub-alignment area AA1a of the first alignment area AAa may be the first light-emitting element ED1 included in the first light-emitting group SLU11 of the first light source unit LU1 of FIG. 3. In addition, the first light-emitting element ED1 disposed in the second sub-alignment area AA2a of the first alignment area AAa may be the first light-emitting element ED1 included in the second light-emitting group SLU12 of the first light source unit LU1 of FIG. 3.

The first non-alignment area NAAa may be disposed to surround the first and second sub-alignment areas AA1a and AA2a of the first alignment area AAa. The first non-alignment area NAAa may include an area positioned between the first sub-alignment area AA1a and the second sub-alignment area AA2a at least. A series connection between the first light-emitting elements ED1 disposed in the first and second sub-alignment areas AA1a and AA2a disposed adjacent to each other may be made in the first non-alignment area NAAa positioned between the first sub-alignment area AA1a and the second sub-alignment area AA2a.

The non-emission area of the first subpixel SPX1 may be an area in which the first light-emitting element ED1 is not disposed and light emitted from the first light-emitting element ED1 does not arrive so that light is not emitted.

The non-emission area of the first subpixel SPX1 may include the first area CBA1. The first area CBA1 may be disposed above the first emission area EMA1 (for example, in the second direction DR2) in a plan view. The first area CBA1 may be disposed between the first emission areas EMA1 of adjacent first subpixels SPX1 in the second direction DR2. A length of the first area CBA1 in a first direction DR1 may be greater than a length of the first emission area EMA1 in the first direction DR1. A length of the first area CBA1 in the second direction DR2 may be smaller than a length of the first emission area EMA1 in the second direction DR2. However, the present disclosure is not limited thereto, and other shapes and sizes may be applied to a planar shape of the first area CBA1 according to a shape of a second bank 600 (e.g., see FIG. 9) to be described below.

The first area CBA1 may be an area in which a plurality of electrodes 211 and 221 included in each of adjacent first subpixels SPX1 in the second direction DR2 are separated. A portion of each of the plurality of electrodes 211 and 221 disposed for each first subpixel SPX1 may be disposed in the first area CBA1. Each of the electrodes 211 and 221 of the first subpixels SPX1 disposed adjacent to each other in the second direction DR2 may be separated in the first area CBA1.

The second subpixel SPX2 may be disposed on the right of the first subpixel SPX1 in a plan view. A planar structure of the second subpixel SPX2 may be substantially the same as a planar structure of the first subpixel SPX1. That is, the second subpixel SPX2 may include the second emission area EMA2 and the non-emission area. The non-emission area may include the second area CBA2 in which a first electrode 212 and a second electrode 222 disposed in the second subpixel SPX2 are separated. The second area CBA2 may be referred to as the second cutout area CBA2.

The second emission area EMA2 may include a second alignment area AAb and a second non-alignment area NAAb. The second alignment area AAb may include a plurality of sub-alignment areas AAb: AA1b and AA2b spaced from each other, and the second non-alignment area NAAb may be disposed to surround the second alignment area AAb. That is, the second non-alignment area NAAb may be an area other than the second alignment area AAb in the second emission area EMA2.

The second alignment area AAb may include one or more sub-alignment areas. The second alignment area AAb may include a number of the alignment areas equal to the number of the sub-alignment areas of the first subpixel SPX1.

For example, when the first alignment area AAa of the first subpixel SPX1 includes the first and second sub-alignment areas AA1a and AA2a, the second alignment area AAb of the second subpixel SPX2 may include a first sub-alignment area AA1b and a second sub-alignment area AA2b. The first sub-alignment area AA1b and the second sub-alignment area AA2b of the second alignment area AAb may be arranged along the second direction DR2. The first sub-alignment area AA1b and the second sub-alignment area AA2b of the second alignment area AAb may be disposed to be spaced from each other.

The second light-emitting elements ED2 disposed in the first sub-alignment area AA1b and the second sub-alignment area AA2b of the second alignment area AAb spaced from each other may be connected in series. For example, the second light-emitting element ED2 disposed in the first sub-alignment area AA1b of the second alignment area AAb may be connected in series with the second light-emitting element ED2 disposed in the second sub-alignment area AA2b of the second alignment area AAb. However, the present disclosure is not limited thereto, and the plurality of second light-emitting elements ED2 disposed in the same sub-alignment area AA1b or AA2b may be connected in parallel, and the second light-emitting elements ED2 disposed in the sub-alignment areas AA1b and AA2b adjacent to each other may be connected in series.

The second light-emitting element ED2 disposed in the first sub-alignment area AA1b of the second alignment area AAb may be the second light-emitting element ED2 included in the first light-emitting group SLU21 of the second light source unit LU2 of FIG. 4. In addition, the second light-emitting element ED2 disposed in the second sub-alignment area AA2b of the second alignment area AAb may be the second light-emitting element ED2 included in the second light-emitting group SLU22 of the second light source unit LU2 of FIG. 4.

The second non-alignment area NAAb may be disposed to surround the first and second sub-alignment areas AA1b and AA2b of the second alignment area AAb. The second non-alignment area NAAb may include an area positioned between the first sub-alignment area AA1b and the second sub-alignment area AA2b at least. A series connection between the second light-emitting elements ED2 disposed in the first and second sub-alignment areas AA1b and AA2b disposed adjacent to each other may be made in the second non-alignment area NAAb positioned between the first sub-alignment area AA1b and the second sub-alignment area AA2b.

The non-emission area of the second subpixel SPX2 may include the second area CBA2. The second area CBA2 may be disposed above the second emission area EMA2 (for example, in the second direction DR2) in a plan view. The second area CBA2 may be an area in which the plurality of electrodes 212 and 222 included in each of adjacent second subpixels SPX2 in the second direction DR2 are separated. A portion of each of the plurality of electrodes 212 and 222 disposed for each second subpixel SPX2 may be disposed in the second area CBA2. Each of the electrodes 212 and 222 of the second subpixels SPX2 disposed adjacent to each other in the second direction DR2 may be separated in the second area CBA2.

The third subpixel SPX3 may be disposed on the right of the second subpixel SPX2 in a plan view.

The third subpixel SPX3 may include the third emission area EMA3 and the non-emission area. The non-emission area may include the third area CBA3 in which a first electrode 213 and a second electrode 223 disposed in the third subpixel SPX3 are separated. The third area CBA3 may be referred to as the third cutout area CBA3.

The third emission area EMA3 may include a third alignment area AAc and a third non-alignment area NAAc. The third alignment area AAc may include a plurality of sub-alignment areas AAc: AA1c, AA2c, and AA3c spaced from each other, and the third non-alignment area NAAc may be disposed to surround the third alignment area AAc. That is, the third non-alignment area NAAc may be an area other than the third alignment area AAc in the third emission area EMA3.

The third alignment area AAc may include the plurality of sub-alignment areas. The third alignment area AAc may include a number of the sub-alignment areas different from the number of the sub-alignment areas of the first subpixel SPX1 and/or the number of the sub-alignment areas of the second subpixel SPX2. In one embodiment, the number of the sub-alignment areas included in the third alignment area AAc may be greater than the number of the sub-alignment areas of the first subpixel SPX1 and/or the number of the sub-alignment areas of the second subpixel SPX2.

For example, when the first alignment area AAa of the first subpixel SPX1 includes the first and second sub-alignment areas AA1a and AA2a, the third alignment area AAc of the third subpixel SPX3 may include a first sub-alignment area AA1c, a second sub-alignment area AA2c, and a third sub-alignment area AA3c. The first to third sub-alignment areas AA1c, AA2c, and AA3c of the third alignment area AAc may be arranged along the second direction DR2. The first to third sub-alignment areas AA1c, AA2c, and AA3c of the third alignment area AAc may be disposed to be spaced from each other.

The third light-emitting elements ED3 disposed in the first to third sub-alignment areas AA1c, AA2c, and AA3c of the third alignment area AAc spaced from each other may be connected in series. For example, the third light-emitting element ED3 disposed in the first sub-alignment area AA1c of the third alignment area AAc may be connected in series with the third light-emitting element ED3 disposed in the second sub-alignment area AA2c of the third alignment area AAc. Similarly, the third light-emitting element ED3 disposed in the second sub-alignment area AA2c of the third alignment area AAc may be connected in series with the third light-emitting element ED3 disposed in the third sub-alignment area AA3c of the third alignment area AAc. However, the present disclosure is not limited thereto, and the plurality of third light-emitting elements ED3 disposed in the same sub-alignment area AA1c, AA2c, or AA3c may be connected in parallel, and the third light-emitting elements ED3 disposed in the sub-alignment areas AA1c, AA2c, and AA3c adjacent to each other may be connected in series.

The third light-emitting element ED3 disposed in the first sub-alignment area AA1c of the third alignment area AAc may be the third light-emitting element ED3 included in the first light-emitting group SLU31 of the third light source unit LU3 of FIG. 5. In addition, the third light-emitting element ED3 disposed in the second sub-alignment area AA2c of the third alignment area AAc may be the third light-emitting element ED3 included in the second light-emitting group SLU32 of the third light source unit LU3 of FIG. 5. Similarly, the third light-emitting element ED3 disposed in the third sub-alignment area AA3c of the third alignment area AAc may be the third light-emitting element ED3 included in the third light-emitting group SLU33 of the third light source unit LU3 of FIG. 5.

The third non-alignment area NAAc may be disposed to surround the first to third sub-alignment areas AA1c, AA2c, and AA3c of the third alignment area AAc. The third non-alignment area NAAc may include an area positioned between the first sub-alignment area AA1c and the second sub-alignment area AA2c of the third alignment area AAc and an area positioned between the second sub-alignment area AA2c and the third sub-alignment area AA3c of the third alignment area AAc at least. A series connection between the third light-emitting elements ED3 disposed in the first to third sub-alignment areas AA1c, AA2c, and AA3c disposed adjacent to each other may be made in the third non-alignment areas NAAc positioned between the first sub-alignment area AA1c, the second sub-alignment AA2c, and the third sub-alignment area AA3c.

The non-emission area of the third subpixel SPX3 may include the third area CBA3. The third area CBA3 may be disposed above the third emission area EMA3 (for example, in the second direction DR2) in a plan view. The third area CBA3 may be an area in which a plurality of electrodes 213 and 223 included in each of the adjacent third subpixels SPX3 in the second direction DR2 are separated. A portion of each of the plurality of electrodes 213 and 223 disposed for each third subpixel SPX3 may be disposed in the third area CBA3. Each of the electrodes 213 and 223 of the third subpixels SPX3 disposed adjacent to each other in the second direction DR2 may be separated in the third area CBA3.

Each pixel PX of the display device 10 may include the first to third subpixels SPX1, SPX2, and SPX3. Each pixel PX of the display device 10 may include first electrodes 210: 211, 212, and 213, second electrodes 220: 221, 222, and 223, and a plurality of contact electrodes included in the first to third subpixels SPX1, SPX2, and SPX3. The display device 10 may further include the first banks 410 and 420 and the second bank 600 (e.g., see, FIG. 9).

The first to third subpixels SPX1, SPX2, and SPX3 may include the first electrodes 210: 211, 212, and 213 and the second electrodes 220: 221, 222, and 223, respectively. The first electrodes 210: 211, 212, and 213 and the second electrodes 220: 221, 222, and 223 may extend in the second direction DR2 in a plan view, and the first electrodes 210: 211, 212, and 213 may be disposed to face the second electrodes 220: 221, 222, and 223 in the first direction DR1 in the subpixels SPX1, SPX2, and SPX3.

The first electrodes 210: 211, 212, and 213 may be disposed at a left side of the corresponding subpixels SPX1, SPX2, and SPX3 in a plan view. The first electrodes 210: 211, 212, and 213 may extend in the second direction DR2 in the corresponding subpixels SPX1, SPX2, and SPX3.

The second electrodes 220: 221, 222, and 223 may be disposed at a right side of the corresponding subpixels SPX1, SPX2, and SPX3 in a plan view. The second electrodes 220: 221, 222, and 223 may extend in the second direction DR2 in the corresponding subpixels SPX1, SPX2, and SPX3. The second electrodes 220: 221, 222, and 223 may be disposed to be spaced from and face the first electrodes 210: 211, 212, and 213 in the first direction DR1.

The first electrodes 210: 211, 212, and 213 may be electrically connected to a circuit element layer PAL (e.g., see FIG. 9) to be described below through first contact holes CT1: CT11, CT12, and CT13. Similarly, the second electrodes 220: 221, 222, and 223 may be electrically connected to the circuit element layer PAL to be described below through second contact holes CT2: CT21, CT22, and CT23. For example, the first electrodes 210: 211, 212, and 213 may be connected to the source electrodes of the first transistors T1 through the first contact hole CT1: CT11, CT12, and CT13, and the second electrodes 220: 221, 222, and 223 may be connected to a second voltage line through the second contact holes CT2 CT21, CT22, and CT23.

The first electrodes 210: 211, 212, and 213 and the second electrodes 220 221, 222, and 223 may extend in the second direction DR2 in the subpixels SPX1, SPX2, and SPX3, respectively. In the first to third areas CBA: CBA1, CBA2, and CBA3, the first electrodes 210: 211, 212, and 213, and the second electrodes 220: 221, 222, and 223 may be separated from other electrodes 210 and 220 included in adjacent subpixels SPX1, SPX2, and SPX3 in the second direction DR2. Such shapes of the first electrode 210 and the second electrode 220 of one pixel PX may be formed through a process of disconnecting the electrodes 210 and 220 in the first to third areas CBA: CBA1, CBA2, and CBA3 after a process of arranging the light-emitting elements ED: ED1, ED2, and ED3 in a manufacturing process of the display device 10. However, the present disclosure is not limited thereto, and some of the electrodes 210 and 220 may extend to the adjacent subpixel SPX in the second direction DR2 to be integrated and disposed, or only one electrode of the first electrode 210 and the second electrode 220 may be separated.

Although in the drawings, one first electrode 210 and one second electrode 220 are illustrated as being disposed for each subpixel SPX, the present disclosure is not limited thereto. In some embodiments, the numbers of the first electrodes 210 and the second electrodes 220 disposed in the subpixels SPX may be greater, and the numbers of the first electrodes 210 and the second electrodes 220 disposed in the subpixels SPX may be different. In addition, the first electrode 210 and the second electrode 220 disposed in each subpixel SPX may not necessarily have a shape extending in one direction, and the first electrode 210 and the second electrode 220 may be disposed in various structures. For example, the first electrode 210 and the second electrode 220 may have a partially curved or bent shape, and one electrode may be disposed to surround another electrode. As long as at least a partial area of the first electrode 210 and at least a partial area of the second electrode 220 are spaced from each other to form an area in which the light-emitting elements ED are to be disposed therebetween, the arrangement structures and shapes of the first electrode 210 and the second electrode 220 are not particularly limited.

The plurality of electrodes 210 and 220 disposed in the subpixels SPX1, SPX2, and SPX3 may be electrically connected to the light-emitting elements ED1, ED2, and ED3 respectively disposed in the subpixels SPX1, SPX2, or SPX3, and a suitable voltage (e.g., a set or predetermined voltage) may be applied thereto such that the light-emitting elements ED1, ED2, and ED3 emit light. For example, the plurality of electrodes 210 and 220 may be electrically connected to the light-emitting elements ED1, ED2, and ED3 respectively disposed in the first to third alignment areas AAa, AAb, and AAc through contact electrodes disposed in the subpixels SPX1, SPX2, and SPX3 and may transmit electrical signals applied to the electrodes 210 and 220 to the light-emitting elements ED1, ED2, and ED3 through the plurality of contact electrodes.

In addition, each of the electrodes 210 and 220 may be used to form an electric field in the subpixels SPX so as to align the light-emitting elements ED1, ED2, and ED3. The light-emitting elements ED1, ED2, and ED3 may be disposed between the first electrode 210 and the second electrode 220 by an electric field formed between the first electrode 210 and the second electrode 220.

The second bank 600 may be disposed to surround a boundary of each subpixel SPX: SPX1, SPX2, or SPX3. The second bank 600 may be disposed in a grid pattern that includes portions extending in the first direction DR1 and the second direction DR2 in a plan view. The second bank 600 may be disposed over the boundaries of the subpixels SPX to distinguish adjacent subpixels SPX.

The second bank 600 may be disposed to surround the first to third emission areas EMA1, EMA2, and EMA3 and the first to third areas CBA1, CBA2, and CBA3 included in the subpixels SPX: SPX1, SPX2, and SPX3 to distinguish the first to third emission areas EMA1, EMA2, and EMA3 and the first to third areas CBA1, CBA2, and CBA3. Each of the first electrode 210 and the second electrode 220 may extend in the second direction DR2 and may be disposed across the portion of the second bank 600 which extends in the first direction DR1.

The second bank 600 may perform a function of preventing inks from overflowing to adjacent subpixels SPX in an inkjet printing process of the manufacturing process of the display device 10. The second bank 600 may separate the inks, in which different light-emitting elements ED are dispersed in the subpixels SPXn, so as to not be mixed with each other. For example, in an embodiment in which the first subpixel SPX1 includes the first light-emitting element ED1, the second subpixel SPX2 includes the second light-emitting element ED2, and the third subpixel SPX3 includes the third light-emitting element ED3, the second bank 600 may separate the first to third light-emitting elements ED1, ED2, and ED3 that are different for the first to third subpixels SPX1, SPX2, and SPX3 so as to not be mixed with each other.

However, the present disclosure is not limited thereto, and even when the same light-emitting element ED is included in the subpixels SPX, the second bank 600 may serve to adjust inks so as to not overflow to the adjacent subpixels SPX and to uniformly maintain the number of the light-emitting elements ED disposed for each subpixel SPX in the inkjet printing process of the manufacturing process of the display device 10.

The second bank 600 may include a hydrophobic material. The first bank 600 may include polyimide (PI), but the present disclosure is not limited thereto.

Hereinafter, the planar arrangements and shapes of the plurality of electrodes 211 and 221, the plurality of first light-emitting elements ED1, and the first contact electrode including the plurality of sub-contact electrodes 710A, 720A, and 730A which are included in the first subpixel SPX1 of the display device 10 will be described with reference to FIG. 8. Hereinafter, only the planar arrangements and shapes of members included in the first subpixel SPX1 will be briefly described, and detailed descriptions of a connection relationship between the members will be described below in conjunction with other drawings.

The plurality of first light-emitting elements ED1 included in the first subpixel SPX1 may be disposed in the first alignment area AAa. In the first alignment area AAa, the plurality of first light-emitting elements ED1 may be disposed such that one end portion thereof is placed on the first electrode 211 and the other end portion thereof is placed on the second electrode 221. In the drawings, the plurality of first light-emitting elements ED1 are illustrated as being disposed in the first alignment area AAa, but at least some of the plurality of first light-emitting elements ED1 may be further disposed in the first non-alignment area NAAa.

The first light-emitting element ED1 may have a shape extending in one direction. In a plan view, the plurality of first light-emitting elements ED1 may be disposed to be spaced from each other in the second direction DR2, in which each of the electrodes 211 and 221 extends, and may be aligned substantially parallel to each other. A spacing interval between the first light-emitting elements ED1 is not particularly limited. In addition, the first light-emitting element ED1 may have a shape extending in one direction, and a direction in which each of the electrodes 211 and 221 extends may be substantially perpendicular to a direction in which the first light-emitting element ED1 extends. However, the present disclosure is not limited thereto, and the first light-emitting element ED1 may be disposed obliquely without being perpendicular to the direction in which each of the electrodes 211 and 221 extends.

The plurality of first light-emitting elements ED1 may include the first light-emitting elements ED1 disposed in the first sub-alignment area AA1a (hereinafter, referred to as "first sub-light-emitting elements") of the first alignment area AAa and the first light-emitting elements ED1 disposed in the second alignment area AA2a (hereinafter, referred to as "second sub-light-emitting element"). The first and second sub-light-emitting elements ED1 may be in contact with the first contact electrode that is disposed in the first and second sub-alignment areas AA1a and AA2a and includes the plurality of sub-contact electrodes 710A, 720A, and 730A to be described below. The first sub-light-emitting element ED1 and the second sub-light-emitting element ED1 disposed in the first subpixel SPX1 may be connected in series through the first contact electrode.

The first subpixel SPX1 may include the first contact electrode including the plurality of sub-contact electrodes 710A, 720A, and 730A disposed to be spaced from each other. The first contact electrodes 710A, 720A, and 730A may be disposed in the first emission area EMA1. The first contact electrodes 710A, 720A, and 730A may include a first sub-contact electrode 710A, a second sub-contact electrode 730A, and a third sub-contact electrode 720A.

Hereinafter, in describing the plurality of electrodes 211 and 221, the plurality of sub-contact electrodes 710A, 720A, and 730A, and the plurality of first light-emitting elements ED1, for convenience of description, it is assumed that one end portion of the first light-emitting element ED1 refers to an end portion disposed at one side facing the first electrode 211, and the other end portion of the first light-emitting element ED1 refers to an end portion disposed at a side opposite to the one side, i.e., an end portion facing the second electrode 221.

The first sub-contact electrode 710A may be disposed on the first electrode 211 in the first sub-alignment area AA1*a* of the first alignment area AAa. The first sub-contact electrode 710A may extend in the second direction DR2 in the first sub-alignment area AA1*a* in a plan view. The first sub-contact electrode 710A may extend in the second direction DR2 in the first sub-alignment area AA1*a* in a plan view and may end to be spaced from a lower side of the first sub-alignment area AA1*a* so as to not extend to the second sub-alignment area AA2*a*. The first sub-contact electrode 710A may be electrically connected to the first electrode 211 through a first opening OP11.

The first sub-contact electrode 710A may be in contact with one end portion of the first light-emitting element ED1 (or the first sub-light-emitting element) disposed in the first sub-alignment area AA1*a*. The first sub-contact electrode 710A may be in contact with each of one end portion of the first light-emitting element ED1 disposed in the first sub-alignment area AA1*a* and the first electrode 211 to electrically connect one end portion of the first light-emitting element ED1 and the first electrode 211.

The second sub-contact electrode 730A may include a first area 731A, a second area 732A, and a third area 733A. The second sub-contact electrode 730A may be disposed over the first sub-alignment area AA1*a* and the second sub-alignment area AA2*a* of the first alignment area AAa and the first non-alignment area NAAa positioned therebetween.

The first area 731A of the second sub-contact electrode 730A may be disposed on the second electrode 221 in the first sub-alignment area AA1*a*. The first area 731A of the second sub-contact electrode 730A may extend in the second direction DR2 in the first sub-alignment area AA1*a* in a plan view.

The first area 731A of the second sub-contact electrode 730A may be disposed to be spaced from and face the first sub-contact electrode 710A in the first direction DR1 in the first sub-alignment area AA1*a*. The first area 731A of the second sub-contact electrode 730A may be in contact with the other end portion of the first light-emitting element ED1 disposed in the first sub-alignment area AA1*a*.

The second area 732A of the second sub-contact electrode 730A may be disposed on the first electrode 211 in the second sub-alignment area AA2*a*. The second area 732A of the second sub-contact electrode 730A may extend in the second direction DR2 in the second sub-alignment area AA2*a* in a plan view.

The second area 732A of the second sub-contact electrode 730A may be disposed to be spaced from the first area 731A of the second sub-contact electrode 730A. The second area 732A of the second sub-contact electrode 730A may be in contact with one end portion of the first light-emitting element ED1 (e.g., the second sub-light-emitting element) disposed in the second sub-alignment area AA2*a*.

The third area 733A of the second sub-contact electrode 730A may be disposed in the first non-alignment area NAAa positioned between the first sub-alignment area AA1*a* and the second sub-alignment area AA2*a*. The third area 733A of the second sub-contact electrode 730A may connect the first area 731A and the second area 732A of the second sub-contact electrode 730A in the first non-alignment area NAAa. The third area 733A of the second sub-contact electrode 730A may be disposed in the first non-alignment area NAAa and may be a connection electrode that serially connects the first sub-light-emitting element ED1 disposed in the first sub-alignment area AA1*a* and the second sub-light-emitting element ED1 disposed in the second sub-alignment area AA2*a*.

The third area 733A of the second sub-contact electrode 730A may extend in the first direction DR1 in the first non-alignment area NAAa positioned between the first sub-alignment area AA1*a* and the second sub-alignment area AA2*a* in a plan view.

The first to third areas 731A, 732A, and 733A of the second sub-contact electrode 730A may be integrated and formed over the first sub-alignment area AA1*a*, the first non-alignment area NAAa, and the second sub-alignment area AA2*a*. The second sub-contact electrode 730A may be in contact with each of the other end portion of the first sub-light-emitting element ED1 and one end portion of the second sub-light-emitting element ED1 that are disposed in the first subpixel SPX1, and thus, the first sub-light-emitting element ED1 and the second sub-light-emitting element ED1 may be connected in series through the second sub-contact electrode 730A. The first area 731A and the second area 732A of the second sub-contact electrode 730A may be contact electrodes in contact with the first light-emitting elements ED1 in the first alignment area AAa, and the third area 733A of the contact electrode 730A may be a series connection electrode that electrically connects the first area 731A and the second area 732A.

The third sub-contact electrode 720A may be disposed on the second electrode 221 in the second sub-alignment area AA2*a* of the first alignment area AAa. The third sub-contact electrode 720A may extend in the second direction DR2 in the second sub-alignment area AA2*a* in a plan view. The third sub-contact electrode 720A may extend in the second direction DR2 in the second sub-alignment area AA2*a* in a plan view and may end to be spaced from an upper side of the second sub-alignment area AA2*a* so as to not extend to the first sub-alignment area AA1*a*. The third sub-contact electrode 720A may be electrically connected to the second electrode 221 through a second opening OP21.

The third sub-contact electrode 720A may be in contact with the other end portion of the first light-emitting element ED1 (or the second sub-light-emitting element) disposed in the second sub-alignment area AA2*a*. The third sub-contact electrode 720A may be in contact with each of the other end portion of the first light-emitting element ED1 disposed in the second sub-alignment area AA2*a* and the second electrode 221 to electrically connect the other end portion of the first light-emitting element ED1 and the second electrode 221.

In some embodiments, the planar arrangements and shapes of the plurality of electrodes 212 and 222, the plurality of second light-emitting elements ED2, and a second contact electrode including a plurality of sub-contact electrodes 710B, 720B, and 730B that are included in the second subpixel SPX2 may be the same as the planar arrangements and shapes of the plurality of electrodes 211 and 221, the plurality of first light-emitting elements ED1, and the first contact electrodes including the plurality of sub-contact electrodes 710A, 720A, and 730A that are included in the first subpixel SPX1. Descriptions of the planar arrangement and shape of the second subpixel SPX2 will be replaced with the descriptions of the first subpixel SPX1.

Next, the planar arrangements and shapes of the plurality of electrodes 213 and 223, the plurality of third light-emitting elements ED3, and a third contact electrode including a plurality of sub-contact electrodes 710C, 720C, 730C, and 740C that are included in the third subpixel SPX3 of the display device 10 will be described with reference to FIG. 8. In the third subpixel SPX3, the number of the sub-contact electrodes and sub-alignment areas included in the third subpixel SPX3 may be different from the number of the sub-contact electrodes and sub-alignment areas included in the first subpixel SPX1 and the second subpixel SPX2. For example, the number of the sub-contact electrodes and sub-alignment areas included in the third subpixel SPX3 may be greater than the number of the sub-contact electrodes and sub-alignment areas included in the first subpixel SPX1 and the second subpixel SPX2.

The plurality of third light-emitting elements ED3 included in the third subpixel SPX3 may be disposed in the third alignment area AAc. The plurality of third light-emitting elements ED3 may be disposed such that one end portion thereof is placed on the first electrode 213 and the other end portion thereof is placed on the second electrode 223 in the third alignment area AAc. In the drawings, the plurality of third light-emitting elements ED3 are illustrated as being disposed in the third alignment area AAc, but at least some of the plurality of third light-emitting elements ED3 may be further disposed in the third non-alignment area NAAc.

The plurality of third light-emitting elements ED3 may include the third light-emitting elements ED3 disposed in the first sub-alignment area AA1c (hereinafter, referred to as "first sub-light-emitting elements"), the third light-emitting elements ED3 disposed in the second sub-alignment area AA2c (hereinafter, referred to as "second sub-light-emitting elements"), and the third light-emitting elements ED3 disposed in the third sub-alignment area AA3c (hereinafter referred to as "third sub-light-emitting elements") in the third alignment area AAc. The first to third sub-light-emitting elements ED3 may be respectively disposed in the first to third sub-alignment areas AA1c, AA2c, and AA3c and may be in contact with the third contact electrode including the plurality of sub-contact electrodes 710C, 720C, 730C, and 740C to be described below. The first to third sub-light-emitting elements ED3 disposed in the third subpixel SPX3 may be connected in series through the third contact electrode.

The third subpixel SPX3 may include the third contact electrode including the plurality of sub-contact electrodes 710C, 720C, 730C, and 740C spaced from each other in the second direction DR2. The third contact electrode may be disposed in the third emission area EMA3. The third sub-contact electrodes 710C, 720C, 730C, and 740C may include a first sub-contact electrode 710C, a second sub-contact electrode 730C, a third sub-contact electrode 740C, and a fourth sub-contact electrode 720C.

Hereinafter, in describing the plurality of electrodes 213 and 223, the plurality of sub-contact electrodes 710C, 720C, 730C, and 740C, and the plurality of third light-emitting elements ED3, for convenience of description, it is assumed that one end portion of the third light-emitting element ED3 refers to an end portion disposed at one side facing the first electrode 213, and the other end portion of the third light-emitting element ED3 refers to an end portion disposed at a side opposite to the one side facing the first electrode 213, that is, an end portion at a side facing the second electrode 223.

The first sub-contact electrode 710C may be disposed on the first electrode 213 in the first sub-alignment area AA1c of the third alignment area AAc. The first sub-contact electrode 710C may extend in the second direction DR2 in the first sub-alignment area AA1c in a plan view and may end to be spaced from a lower side of the first sub-alignment areas AA1c so as to not extend to the second sub-alignment area AA2c. The first sub-contact electrode 710C may be electrically connected to the first electrode 213 through a first opening OP13.

The first sub-contact electrode 710C may be in contact with one end portion of the third light-emitting element ED3 (or the first sub-light-emitting element) disposed in the first sub-alignment area AA1c. The first sub-contact electrode 710C may be in contact with each of one end portion of the third light-emitting element ED3 disposed in the first sub-alignment area AA1c and the first electrode 213 to electrically connect one end portion of the third light-emitting element ED3 and the first electrode 213.

The second sub-contact electrode 730C may include a first area 731C, a second area 732C, and a third area 733C. The second sub-contact electrode 730C may be disposed over the first sub-alignment area AA1c and the second sub-alignment area AA2c of the third alignment area AAc and the third non-alignment area NAAc positioned therebetween.

The first area 731C of the second sub-contact electrode 730C may be disposed on the second electrode 223 in the first sub-alignment area AA1c. The first area 731C of the second sub-contact electrode 730C may be disposed to be spaced from and face the first sub-contact electrode 710C in the first direction DR1 in the first sub-alignment area AA1c. The first area 731C of the second sub-contact electrode 730C may be in contact with the other end portion of the third light-emitting element ED3 disposed in the first sub-alignment areas AA1c.

The second area 732C of the second sub-contact electrode 730C may be disposed on the first electrode 213 in the second sub-alignment area AA2c. The second area 732C of the second sub-contact electrode 730C may be disposed to be spaced from the first area 731C of the second sub-contact electrode 730C. The second area 732C of the second sub-contact electrode 730C may be in contact with one end portion of the third light-emitting element ED3 (or the second sub-light-emitting element) disposed in the second sub-alignment area AA2c.

The third area 733C of the second sub-contact electrode 730C may connect the first areas 731C and the second area 732C of the second sub-contact electrode 730C in the third non-alignment area NAAc. The third area 733C of the second sub-contact electrode 730C may be a connection electrode that serially connects the first sub-light-emitting element ED3 disposed in the first sub-alignment area AA1c and the second sub-light-emitting element ED3 disposed in the second sub-alignment area AA2c.

The second sub-contact electrode 730C may be in contact with each of the other end portion of the first sub-light-emitting element ED3 and one end portion of the second sub-light-emitting element ED3 that are disposed in the third subpixel SPX3, and thus, the first sub-light-emitting element ED3 and the second sub-light-emitting element ED3 may be connected in series through the second sub-contact electrode 730C. The first area 731C and the second area 732C of the second sub-contact electrode 730C may be contact electrodes in contact with the third light-emitting elements ED3 in the third alignment area AAc. The third area 733C of the second sub-contact electrode 730C may be a series connection electrode that electrically connects the first area 731C and the second area 732C.

The third sub-contact electrode 740C may include a first area 741C, a second area 742C, and a third area 743C. The third sub-contact electrode 740C may be disposed over the second sub-alignment area AA2c and the third sub-alignment area AA3c of the third alignment area AAc and the third non-alignment area NAAc positioned therebetween.

The first area 741C of the third sub-contact electrode 740C may be disposed on the second electrode 223 in the second sub-alignment area AA2c. The first area 741C of the third sub-contact electrode 740C may be disposed to be spaced from and face the second area 732C of the second sub-contact electrode 730C in the first direction DR1 in the second sub-alignment area AA2c. The first area 741C of the third sub-contact electrode 740C may be in contact with the other end portion of the third light-emitting element ED3 disposed in the second sub-alignment area AA2c.

The second area 742C of the third sub-contact electrode 740C may be disposed on the first electrode 213 in the third sub-alignment area AA3c. The second area 742C of the third sub-contact electrode 740C may be disposed to be spaced from the first area 741C of the third sub-contact electrode 740C in the second direction DR2. The second area 742C of the third sub-contact electrode 740C may be in contact with one end portion of the third light-emitting element ED3 (or the third sub-light-emitting element) disposed in the third sub-alignment area AA3c.

The third area 743C of the third sub-contact electrode 740C may connect the first area 741C and the second area 742C of the third sub-contact electrode 740C in the third non-alignment area NAAc. The third area 743C of the third sub-contact electrode 740C may be a connection electrode that serially connects the second sub-light-emitting element ED3 disposed in the second sub-alignment area AA2c and the third sub-light-emitting element ED3 disposed in the third sub-alignment area AA3c.

The third sub-contact electrode 740C may be in contact with each of the other end portion of the second sub-light-emitting element ED3 and one end portion of the third sub-light-emitting element ED3 that are disposed in the third subpixel SPX3, and thus, the second sub-light-emitting element ED3 and the third sub-light-emitting element ED3 may be connected in series through the third sub-contact electrode 740C. The first area 741C and the second area 742C of the third sub-contact electrode 740C may be contact electrodes in contact with the third light-emitting elements ED3 in the third alignment area AAc. The third area 743C of the third sub-contact electrode 740C may be a series connection electrode that electrically connects the first area 741C and the second area 742C.

The fourth sub-contact electrode 720C may be disposed on the second electrode 223 in the third sub-alignment area AA3c of the third alignment area AAc. The fourth sub-contact electrode 720C may extend in the second direction DR2 in the third sub-alignment area AA2c in a plan view. The fourth sub-contact electrode 720C may extend in the second direction DR2 in the third sub-alignment area AA3c in a plan view and may end to be spaced from an upper side of the third sub-alignment areas AA3c so as to not extend to the second sub-alignment area AA2c. The fourth sub-contact electrode 720C may be electrically connected to the second electrode 223 through a second opening OP23.

The fourth sub-contact electrode 720C may be in contact with the other end portion of the third light-emitting element ED3 (or the third sub-light-emitting element) disposed in the third sub-alignment area AA3c. The fourth sub-contact electrode 720C may be in contact with each of the other end portion of the third light-emitting element ED3 disposed in the third sub-alignment area AA3c and the second electrode 223 to electrically connect the other end portion of the third light-emitting element ED3 and the second electrode 223.

Figure 9:
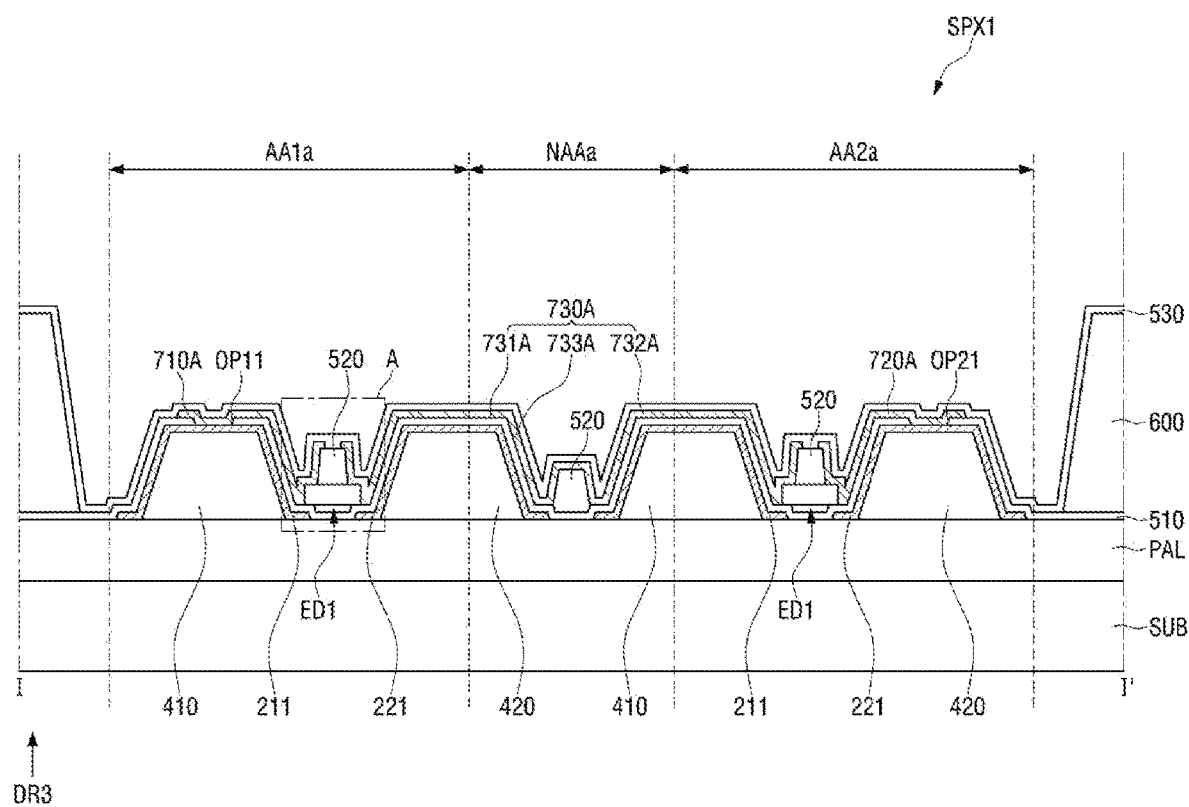
FIG. 9 is a cross-sectional view taken along the line I-I' of FIG. 8.
Figure 10:
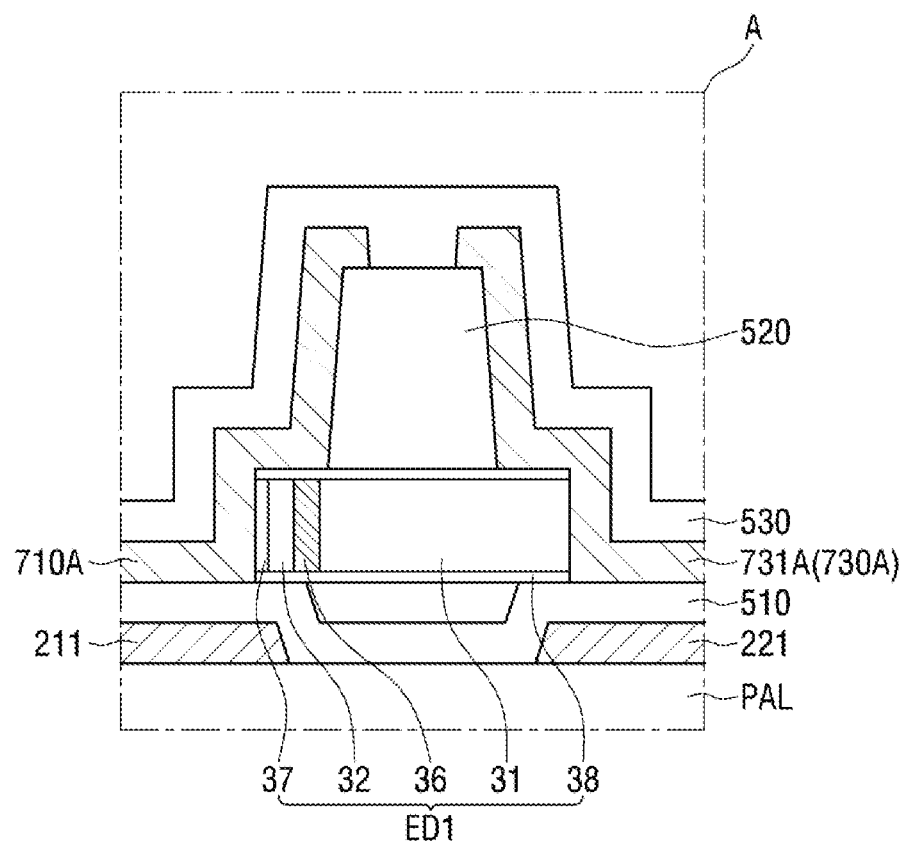
FIG. 10 is an enlarged cross-sectional view illustrating an example of area A of FIG. 9.
Figure 11:
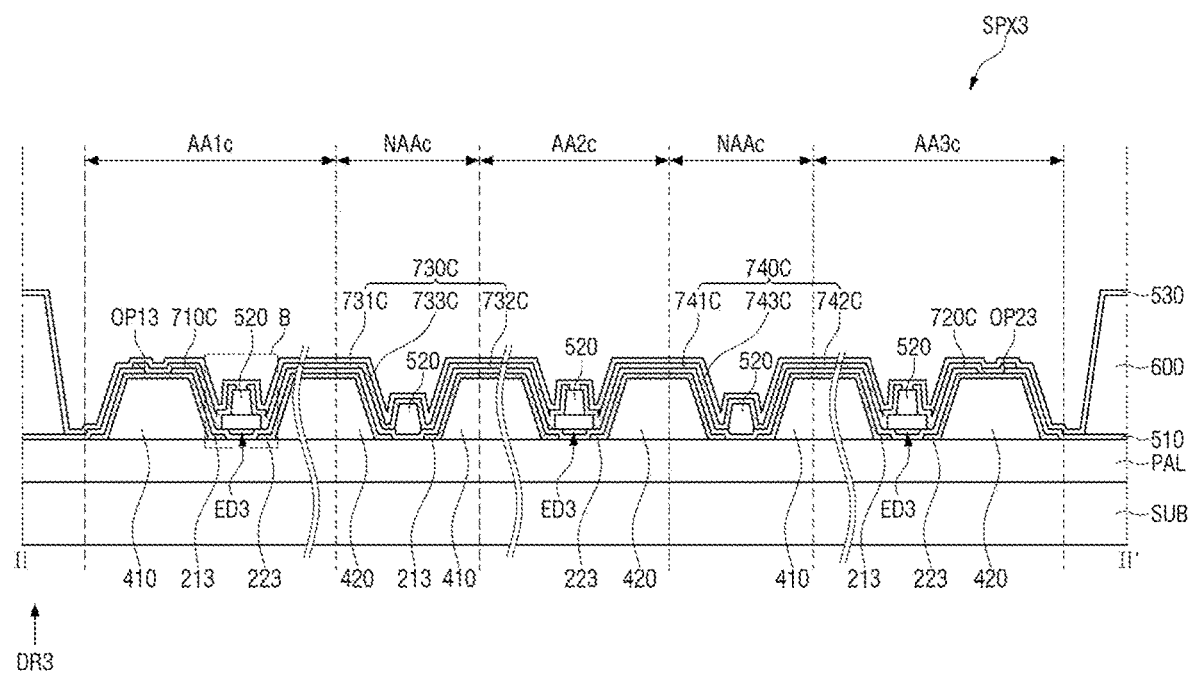
FIG. 11 is a cross-sectional view taken along the line II-II' of FIG. 8.
Figure 12:
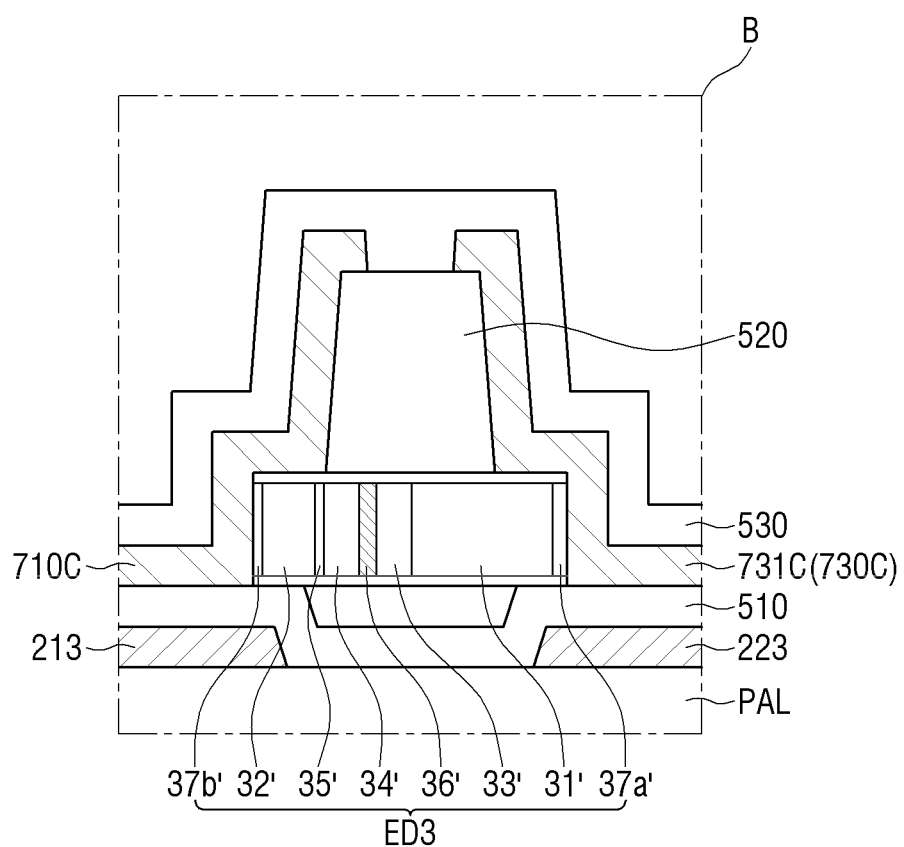
FIG. 12 is an enlarged cross-sectional view of area B of FIG. 11.

FIG. 9 is a cross-sectional view taken along the line I-I' of FIG. 8. FIG. 10 is an enlarged cross-sectional view illustrating an example of area A of FIG. 9. FIG. 11 is a cross-sectional view taken along the line II-II' of FIG. 8. FIG. 12 is an enlarged cross-sectional view of area B of FIG. 11.

Hereinafter, the cross-sectional structure of the display device 10 will be described with reference to FIGS. 9-12.

Referring to FIGS. 9-12, the display device 10 may include a substrate SUB, the circuit element layer PAL disposed on the substrate SUB, and a light-emitting element layer disposed on the circuit element layer PAL. The light-emitting element layer may include the first banks 410 and 420, the first and second electrodes 210 and 220, the second bank 600, the light-emitting elements ED: ED1, ED2, and ED3, the plurality of contact electrodes, and first to third insulating layers 510, 520, and 530.

The substrate SUB may be an insulating substrate. The substrate SUB may be made of an insulating material such as glass, quartz, or a polymer resin. The substrate SUB may be a rigid substrate but may also be a flexible substrate that is bendable, foldable, and/or rollable.

The circuit element layer PAL may be disposed on the substrate SUB. The circuit element layer PAL may include at least one transistor or the like described above with reference to FIGS. 3-5 to drive the light-emitting element layer.

The first banks 410 and 420 may be disposed on the circuit element layer PAL. Although not shown in the drawings, the circuit element layer PAL may include a via layer, and the first banks 410 and 420 may be disposed on the via layer of the circuit element layer PAL.

The first banks 410 and 420 may have a shape extending in the second direction DR2 in each pixel PX in a plan view. The first banks 410 and 420 may include first and second sub-banks 410 and 420 spaced from each other. Spacing spaces formed by the first and second sub-banks 410 and 420 being spaced apart from each other may provide areas in which the plurality of light-emitting elements ED: ED1, ED2, and ED3 are disposed.

The first and second sub-banks 410 and 420 may each have a structure of which at least a portion protrudes based on an upper surface of the substrate SUB. The protruding portions of the first and second sub-banks 410 and 420 may have inclined side surfaces. The first and second sub-banks 410 and 420 may have the inclined side surfaces and thus may serve to change a traveling direction of light that is emitted from the light-emitting elements ED: ED1, ED2, and ED3 and travels toward the side surfaces of the first and second sub-banks 410 and 420, into an upward direction (for example, a display direction).

First, the cross-sectional structure of the first subpixel SPX1 will be described with reference to FIGS. 8-10.

The first and second electrodes 211 and 221 of the first subpixel SPX1 may be disposed on the first and second sub-banks 410 and 420, respectively. The first and second electrodes 211 and 220 may be disposed to be spaced from each other.

The first electrode 211 may extend in the second direction DR2 in a plan view so as to overlap a partial area of the second bank 600 that extends in the first direction DR1. The first electrode 211 may be electrically connected to the circuit element layer PAL through a first contact hole CT11.

The second electrode 221 may extend in the second direction DR2 in a plan view so as to overlap a partial area of the second bank 600 that extends in the first direction DR1. The second electrode 221 may be electrically connected to the circuit element layer PAL through a second contact hole CT21.

The first and second electrodes 211 and 221 may each be electrically connected to the first light-emitting element ED1, and a suitable voltage (e.g., a set or predetermined voltage) may be applied thereto such that the first light-emitting element ED1 emits light. The first and second electrodes 211 and 221 may be electrically connected to the first light-emitting elements ED1 disposed between the first electrode 211 and the second electrode 221 through the plurality of contact electrodes 710A, 720A, and 730A and may transmit electrical signals applied to the electrodes 211 and 221 to the first light-emitting elements ED1 through the contact electrodes 710A, 720A, and 730A.

The first insulating layer 510 may be disposed on the plurality of electrodes 211 and 221. The first insulating layer 510 may be disposed on an entirety of the first and second electrodes 211 and 221 disposed on the first and second sub-banks 410 and 420 including an area between the first electrode 211 and the second electrode 221.

The first insulating layer 510 may be disposed on the first electrode 211 and the second electrode 221 and may also be disposed to expose at least portions of the first electrode 211 and the second electrode 221.

The first insulating layer 510 may have the first opening OP11 exposing an upper surface of the first electrode 211 disposed on the first sub-bank 410 in the first sub-alignment area AA1a of the first alignment area AAa. The first electrode 211 and the first sub-contact electrode 710A may be in contact with each other in the first sub-alignment area AA1a through the first opening OP11. Because the first electrode 211 and the first sub-contact electrode 710A are in contact with each other through the first opening OP11, the first electrode 211 may be electrically connected to the first light-emitting element ED1 disposed in the first sub-alignment area AA1a through the first sub-contact electrode 710A.

The first insulating layer 510 may have the second opening OP21 exposing an upper surface of the second electrode 221 disposed on the second sub-bank 420 in the second sub-alignment area AA2a of the first alignment area AAa. The second electrode 221 and the third sub-contact electrode 720A may be in contact with each other in the second sub-alignment area AA2a through the second opening OP21. Because the second electrode 221 and the third sub-contact electrode 720A are in contact with each other through the second opening OP21, the second electrode 221 may be electrically connected to the first light-emitting element ED1 disposed in the second sub-alignment area AA2a through the third sub-contact electrode 720A.

The first insulating layer 510 may be interposed between the second sub-contact electrode 730A and the first and second electrodes 211 and 221. Because the first insulating layer 510 is interposed between the second sub-contact electrode 730A and the first and second electrodes 211 and 221, the second sub-contact electrode 730A may be insulated from the first and second electrodes 211 and 221. The second sub-contact electrode 730A may not be connected to the first and second electrodes 211 and 221 through direct contact but may be electrically connected to the first and second electrodes 211 and 221 through the first light-emitting element ED1.

The first insulating layer 510 may protect the first electrode 211 and the second electrode 221 and may concurrently insulate the first electrode 211 from the second electrode 221. In addition, the first insulating layer 510 may prevent or protect the first light-emitting element ED1 disposed on the first insulating layer 510 from being damaged by direct contact with other members. Furthermore, as described above, the first insulating layer 510 may prevent contact between the second sub-contact electrode 730A and the first and second electrodes 211 and 221 and thus may allow the first light-emitting elements ED1 disposed in the first to second sub-alignment areas AA1a and AA2a to be connected in series through the second sub-contact electrode 730A.

The first insulating layer 510 may include an inorganic insulating material or an organic insulating material. In an embodiment, as the inorganic insulating material, the first insulating layer 510 may include an inorganic insulating material such as silicon oxide ($SiO_x$), silicon nitride ($SiN_x$), silicon oxynitride ($SiO_xN_y$), aluminum oxide ($AlO_x$), or aluminum nitride (AlN).

The second bank 600 may be disposed on the first insulating layer 510. The second bank 600 may be formed to have a height greater than that of the first banks 410 and 420.

The first light-emitting elements ED1 may be disposed in the first and second sub-alignment areas AA1a and AA2a. The first light-emitting element ED1 may be disposed on the first insulating layer 510 between the first sub-bank 410 and the second sub-bank 420 such that both end portions thereof are disposed on the first electrode 211 and the second electrode 221.

The second insulating layer 520 may be disposed on the first insulating layer 510 between the first sub-bank 410 and the second sub-bank 420. The second insulating layer 520 may be partially disposed on the first light-emitting elements ED1 disposed between the first sub-bank 410 and the second sub-bank 420 in the first and second sub-alignment areas AA1a and AA2a. The second insulating layer 520 may be disposed to partially surround an outer surface (e.g., an outer peripheral or circumferential surface) of the first light-emitting element ED1. The second insulating layer 520 may be disposed on the first light-emitting element ED1 in the first and second sub-alignment areas AA1a and AA2a and may expose one end portion and the other end portion of the first light-emitting element ED1. A portion of the second insulating layer 520 disposed on the first light-emitting element ED1 may have a shape extending in the second direction DR2 between the first electrode 211 and the second electrode 221 in a plan view.

The second insulating layer 520 may include an inorganic insulating material or an organic insulating material. In an embodiment, the second insulating layer 520 may include an inorganic insulating material. When the second insulating layer 520 includes the inorganic insulating material, the second insulating layer 520 may include silicon oxide ($SiO_x$), silicon nitride ($SiN_x$), silicon oxynitride ($SiO_xN_y$), aluminum oxide ($AlO_x$), aluminum nitride (AlN), or the like. In some other embodiments, the second insulating layer 520 may include an organic insulating material. When the second insulating layer 520 includes the organic insulating material, the second insulating layer 520 may include an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited thereto.

The plurality of contact electrodes 710A, 720A, and 730A may be disposed on the second insulating layer 520. As described above, the first sub-contact electrode 710A may be in contact with the upper surface of the first electrode 211 through the first opening OP11 to be electrically connected to the first electrode 211. Accordingly, the first sub-contact electrode 710A may be in contact with each of one end portion of the first sub-light-emitting element ED1 disposed in the first sub-alignment area AA1a and the first electrode 211 to electrically connect one end portion of the first sub-light-emitting element ED1 and the first electrode 211. The second sub-contact electrode 730A is disposed over the first and second sub-alignment areas AA1a and AA2a, and thus, the other end portion of the first sub-light-emitting element ED1 and one end portion of the second sub-light-emitting element ED1 may be connected in series through the second sub-contact electrode 730A. As described above, the third sub-contact electrode 720A may be in contact with the upper surface of the second electrode 221 through the second opening OP21 to be electrically connected to the second electrode 221. Accordingly, the third sub-contact electrode 720A may be in contact with each of the other end portion of the second sub-light-emitting element ED1 disposed in the second sub-alignment area AA2a and the second electrode 221 to electrically connect the other end portion of the second sub-light-emitting element ED1 and the second electrode 221.

The plurality of contact electrodes 710A, 720A, and 730A may include a conductive material. For example, the plurality of contact electrodes 710A, 720A, and 730A may include ITO, IZO, ITZO, aluminum (Al), or the like. As an example, the plurality of contact electrodes 710A, 720A, and 730A may include a transparent conductive material, but the present disclosure is not limited thereto.

The third insulating layer 530 may be disposed on an entirety of the substrate SUB. The third insulating layer 530 may function to protect members disposed on the substrate SUB from an external environment. The third insulating layer 530 may include an inorganic insulating material or an organic insulating material. The third insulating layer 530 may include at least one selected from among the materials listed, for example, as the materials that may be included in the second insulating layer 520.

Referring to FIG. 10, both end portions of the first light-emitting element ED1 may be in contact with at least one of the contact electrodes 710A, 720A, and 730A. Hereinafter, a plurality of layers included in the first light-emitting element ED1 disposed in the first sub-alignment area AA1a of the first alignment area AAa and the first sub-contact electrode 710A and the second sub-contact electrode 730A in contact with both end portions of the first light-emitting element ED1 will be described.

The first sub-contact electrode 710A may be in contact with one end portion of the first sub-light-emitting element ED1 disposed in the first sub-alignment area AA1a. In an embodiment, an electrode layer 37 of the first light-emitting element ED1 may be positioned at one end portion of the first sub-light-emitting element ED1, and a first semiconductor layer 31 of the first light-emitting element ED1 may be positioned at the other end portion of the first light-emitting element ED1. An insulating film 38 may be disposed on an outer surface (e.g., an outer peripheral or circumferential surface) of the first sub-light-emitting element ED1. The plurality of layers of the first light-emitting element ED1 may be sequentially disposed so as to be parallel to the upper surface of the substrate SUB.

The first sub-contact electrode 710A and the second sub-contact electrode 730A (or the first area 731A of the second sub-contact electrode 730A) disposed on the second insulating layer 520 may be disposed to be spaced from each other on the second insulating layer 520.

Hereinafter, the cross-sectional structure of the third subpixel SPX3 will be described with reference to FIGS. 8, 11, and 12. In describing FIGS. 11 and 12, repetitive descriptions of the same configurations as those described above will be omitted or simplified, and differences will be mainly described.

In the first sub-alignment area AA1c of the third alignment area AAc, the first sub-contact electrode 710C may be in contact with one end portion of the first sub-light-emitting element ED3. The first sub-contact electrode 710C may be in contact with the first electrode 213 through the first opening OP13. That is, the first sub-contact electrode 710C may be in contact with the first electrode 213 and one end portion of the first sub-light-emitting element ED3.

In the first and second sub-alignment areas AA1c and AA2c of the third alignment area AAc, the second sub-contact electrode 730C may be in contact with each of the other end portion of the first sub-light-emitting element ED3 and one end portion of the second sub-light-emitting element ED3. For example, in the first sub-alignment area AA1c, the first area 731C of the second sub-contact electrode 730C may be in contact with the other end portion of the first sub-light-emitting element ED3. In the second sub-alignment area AA2c, the second area 732C of the second sub-contact electrode 730C may be in contact with one end portion of the second sub-light-emitting element ED3. The first area 731C and the second area 732C of the second sub-contact electrode 730C may be electrically connected to each other through the third area 733C of the second sub-contact electrode 730C disposed in the third non-alignment area NAAc positioned between the first sub-alignment area AA1c and the second sub-alignment area AA2c of the third alignment area AAc.

In the second and third sub-alignment areas AA2c and AA3c of the third alignment area AAc, the third sub-contact electrode 740C may be in contact with each of the other end portion of the second sub-light-emitting element ED3 and one end portion of the third sub-light-emitting element ED3. For example, in the second sub-alignment area AA2c, the first area 741C of the third sub-contact electrode 740C may be in contact with the other end portion of the second sub-light-emitting element ED3. In the third sub-alignment area AA3c, the second area 742C of the third sub-contact electrode 740C may be in contact with one end portion of the third sub-light-emitting element ED3. The first area 741C and the second area 742C of the third sub-contact electrode 740C may be electrically connected to each other through the third area 743C of the third sub-contact electrode 740C disposed in the third non-alignment area NAAc positioned between the second sub-alignment area AA2c and the third sub-alignment area AA3c of the third alignment area AAc.

In the third sub-alignment area AA3c of the third alignment area AAc, the fourth sub-contact electrode 720C may be in contact with the other end portion of the third sub-light-emitting element ED3. The fourth sub-contact electrode 720C may be in contact with the second electrode 223 through the second opening OP23. That is, the fourth sub-contact electrode 720C may be in contact with the second electrode 223 and the other end portion of the third sub-light-emitting element ED3.

In the third subpixel SPX3, a current supplied through the first transistor T1 may be transmitted to one end portion of the first sub-light-emitting element ED3 through the first sub-contact electrode 710C, and a second voltage applied to the second electrode 223 through a second voltage line VL2 may be transmitted to the other end portion of the third sub-light-emitting element ED3 through the fourth sub-contact electrode 720C. Accordingly, an electrical signal transmitted to the first sub-light-emitting element ED3 through the first sub-contact electrode 710A may be transmitted along the first sub-light-emitting element ED3 and the second sub-contact electrode 730c disposed in the first sub-alignment area AA1c of the third alignment area AAc, the second sub-light-emitting element ED3 and the third sub-contact electrode 740C disposed in the second sub-alignment area AA2c of the third alignment area AAc, and the third sub-light-emitting element ED3 and the fourth sub-contact electrode 720C disposed in the third sub-alignment area AA3c of the third alignment area AAc.

According to one embodiment, the light-emitting elements ED3 disposed in the third alignment area AAc of the third subpixel SPX3 may be connected in series through the plurality of contact electrodes 710C, 720C, 730C, and 740C.

When one light-emitting element ED of the plurality of light-emitting elements ED disposed in the same sub-alignment area AA is defective and short-circuited, in the sub-alignment area AA including the defective light-emitting element ED, because a current may not flow through the defective light-emitting element ED, an electrical signal may not be transmitted to normal light-emitting elements ED. Therefore, the normal light-emitting elements ED may not emit light. For example, when one first sub-light-emitting element ED3 of the plurality of first sub-light-emitting elements ED3 disposed in the first sub-light-emitting area AA1c is short-circuited, a current may not flow in other normal third light-emitting elements ED3 disposed in the first sub-alignment area AA1c. Thus, the normal third light-emitting elements ED3 may not emit light. However, even in this case, because an electrical signal is transmitted to the second and third sub-light-emitting elements ED3 connected in series that are disposed in the second sub-alignment area AA2c and the third sub-alignment area AA3c, the second and third sub-light-emitting elements ED3 disposed in the second sub-alignment area AA2c and the third sub-alignment area AA3c may emit light.

That is, when a plurality of sub-alignment areas AAna, AAnb, and AAnc are disposed in subpixels SPX1, SPX2, and SPX3 and the light-emitting elements ED disposed in each of the sub-alignment areas AAna, AAnb, and AAnc are connected in series, even though the defective light-emitting element ED is disposed in one of the sub-alignment areas AAna, AAnb, and AAnc, light may be emitted through the light-emitting elements ED disposed in other sub-alignment areas AAna, AAnb, and AAnc (wherein n is a natural number).

Figure 13:
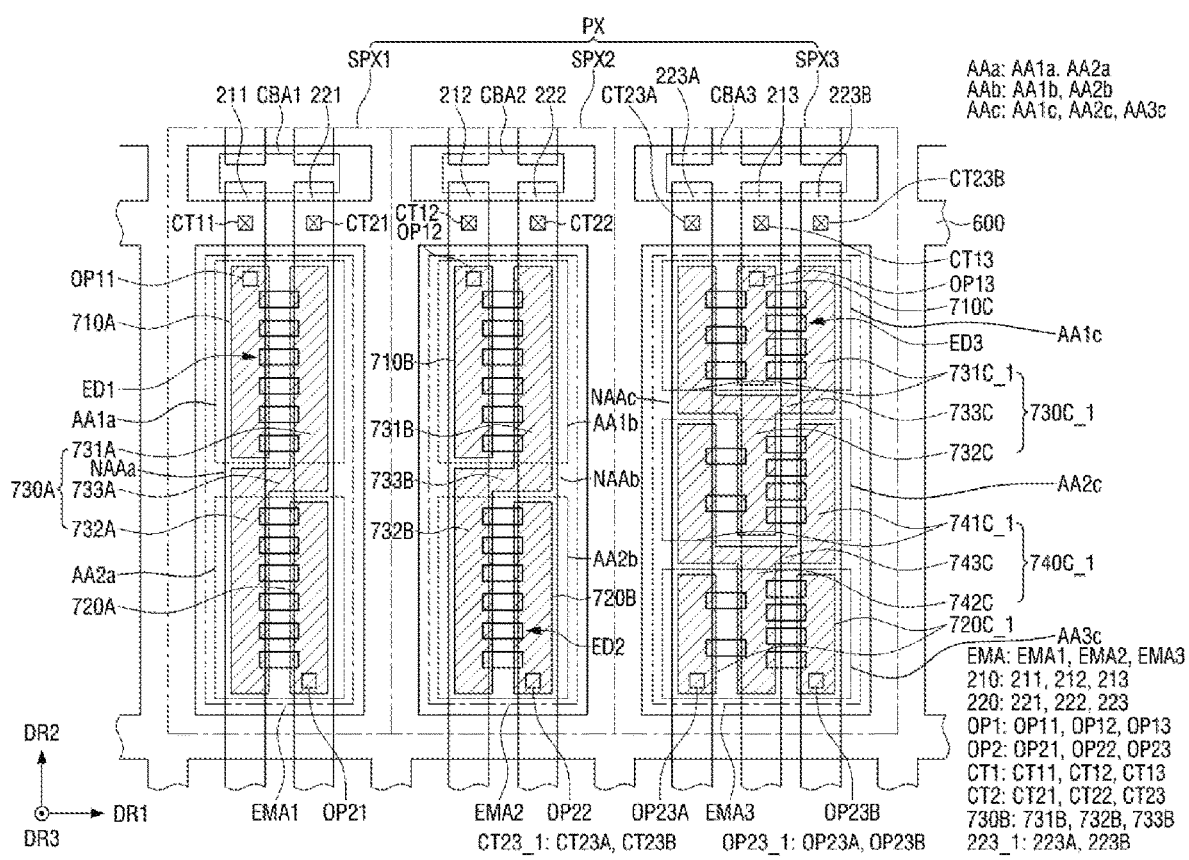
FIG. 13 is a schematic plan layout of one pixel of a display device according to an embodiment.

FIG. 13 is a schematic plan layout of one pixel of a display device according to another embodiment.

Referring to FIG. 13, the present embodiment is different from the embodiment of FIG. 8 in that a third subpixel SPX3 includes one first electrode 213 and two second electrodes 223A and 223B.

For example, the third subpixel SPX3 may include two second electrodes 223A and 223B respectively disposed on the right and the left of the first electrode 213. Accordingly, the second electrodes 223A and 223B may be connected to a circuit element layer PAL through second contact holes CT23A and CT23B, respectively.

A second sub-contact electrode 730C_1 of a third contact electrode may include two first areas 731C_1 disposed on the second electrodes 223A and 223B of a first sub-alignment area AA1c. A third area 733C of the second sub-contact electrode 730C_1 may connect a second area 732C of the second sub-contact electrode 730C_1 disposed on the first electrode 213 of a second sub-alignment area AA2c and the first areas 731C_1 of the second sub-contact electrode 730C_1 disposed on the second electrodes 223A and 223B of the first sub-alignment area AA1c.

Similarly, a third sub-contact electrode 740C_1 may include two first areas 741C_1 disposed on the second electrodes 223A and 223B of the second sub-alignment area AA2c. A third area 743C of the third sub-contact electrode 740C_1 may connect a second area 742C of the third sub-contact electrode 740C_1 disposed on the first electrode 213 of a third sub-alignment area AA3c and the first areas 741C_1 of the third sub-contact electrode 740C_1 disposed on the second electrodes 223A and 223B of the second sub-alignment area AA2c.

Fourth sub-contact electrodes 720C_1 may be disposed on the second electrodes 223A and 223B of the third sub-alignment area AA3c, respectively. The fourth sub-contact electrodes 720C_1 may be in contact with the second electrodes 223A and 223B through second openings OP23_1: OP23A and OP23B.

Figure 14:
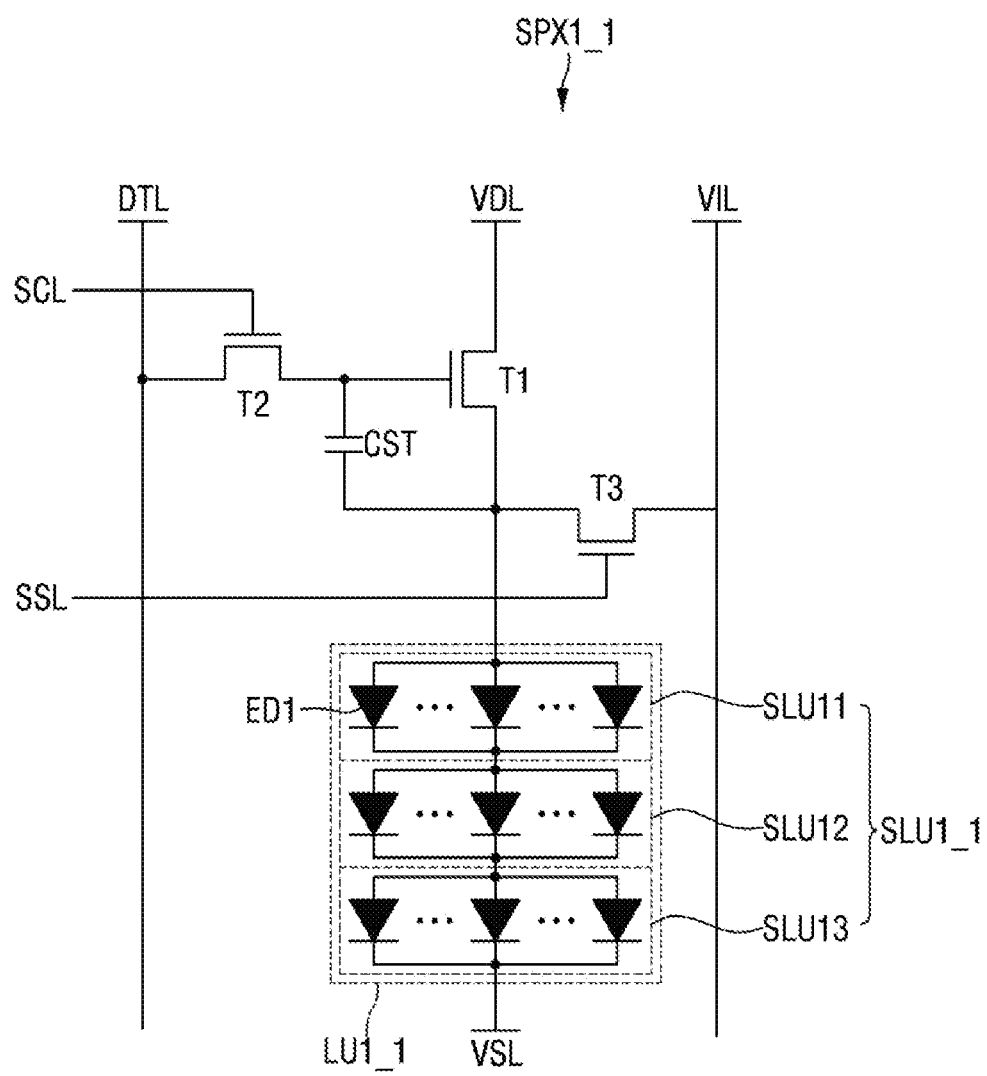
FIG. 14 is an equivalent circuit diagram of a first subpixel of a display device according to an embodiment.
Figure 15:
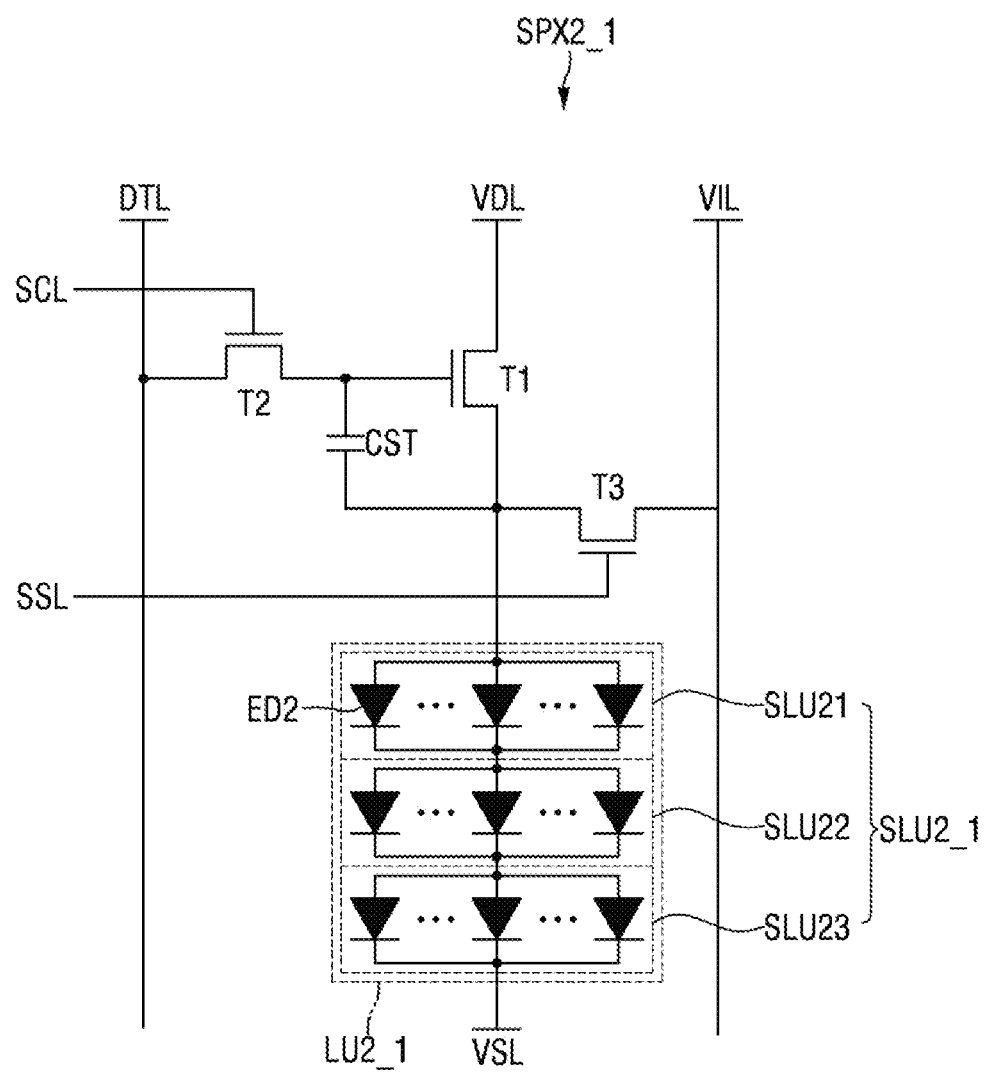
FIG. 15 is an equivalent circuit diagram of a second subpixel of the display device according to an embodiment.
Figure 16:
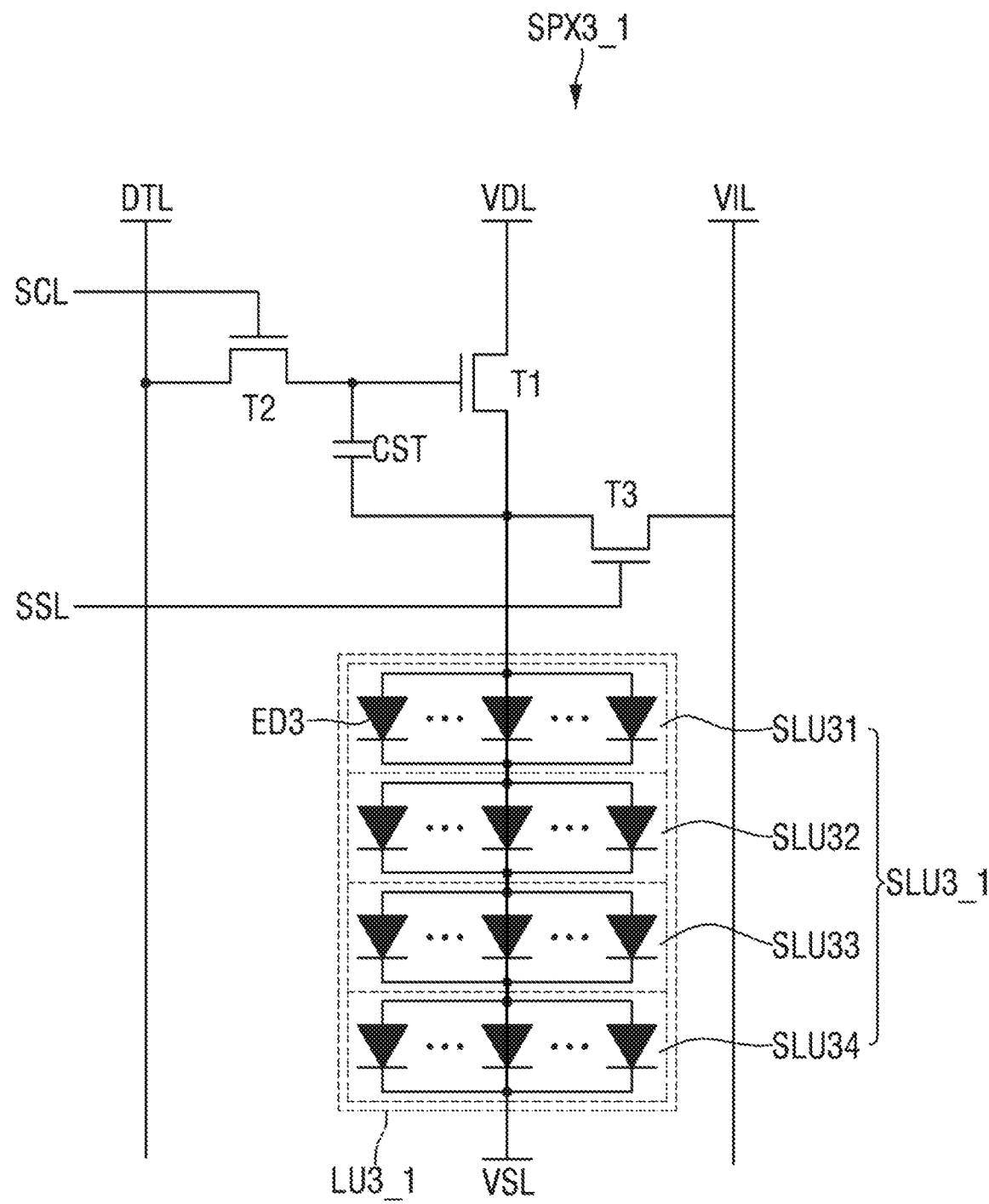
FIG. 16 is an equivalent circuit diagram of a third subpixel of the display device according to an embodiment.

FIG. 14 is an equivalent circuit diagram of a first subpixel of a display device according to an embodiment. FIG. 15 is an equivalent circuit diagram of a second subpixel of the display device according to an embodiment. FIG. 16 is an equivalent circuit diagram of a third subpixel of the display device according to an embodiment.

Referring to FIGS. 14 and 15, the present embodiment is different from the embodiment of FIGS. 3 and 4 in that a first light-emitting unit LU1_1 of a first subpixel SPX1_1 and a second light-emitting unit LU2_1 of a second subpixel SPX2_1 include three light-emitting groups SLU1_1: SLU11, SLU12, SLU13 and three light-emitting units SLU2_1: SLU21, SLU22, and SLU23, respectively. Similarly, referring to FIG. 16, the present embodiment is different from the embodiment of FIG. 5 in that a third light-emitting unit LU3_1 of a third subpixel SPX3_1 includes four light-emitting groups SLU3_1: SLU31, SLU32, SLU33, and SLU34. That is, when the light-emitting groups of the first and second subpixels SPX1_1 and SPX2_1 include a three-stage series connection structure, the light-emitting group of the third subpixel SPX3_1 may include a four-stage series connection structure. Even in this case, because the number of series connections between third light-emitting elements ED3 included in the third subpixel SPX3_1 including the third light-emitting elements ED3 configured to emit red light is greater than the number of series connections between first light-emitting elements ED1 included in the first subpixel SPX_1 and the number of series connections between second light-emitting elements ED2 included in the second subpixel SPX_2, it is possible to reduce or minimize power loss that may occur due to a difference in operating voltage between the light-emitting elements.

Figure 17:
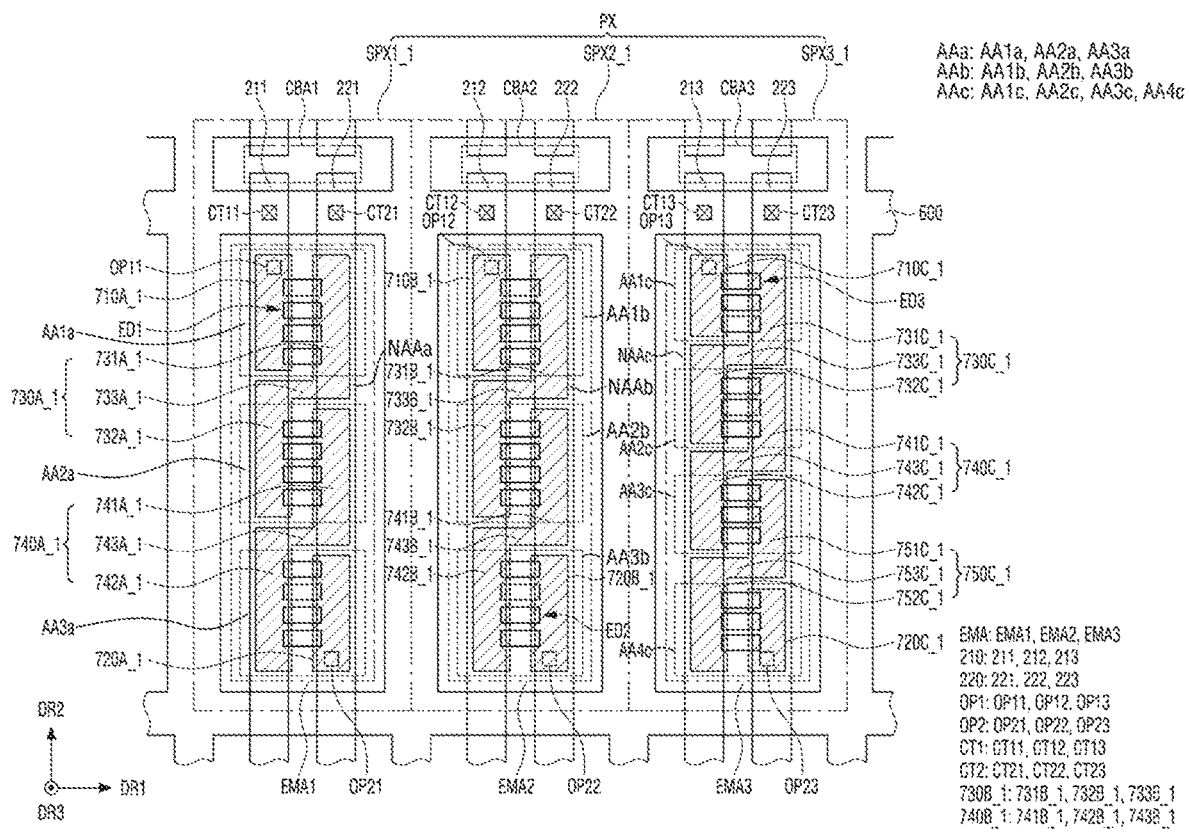
FIG. 17 is a schematic plan layout of one pixel of a display device including the equivalent circuits for the first to third subpixels as shown in the diagrams of FIGS. 14-16.

FIG. 17 is a schematic plan layout of one pixel of a display device including the equivalent circuit diagrams of FIGS. 14-16.

Referring to FIG. 17, first and second subpixels SPX1_1 and SPX2_1 may include first to third sub-alignment areas AA1a, AA2a, and AA3a and first to third sub-alignment areas AA1b, AA2b, and AA3b, respectively. In addition, the present embodiment is different from the embodiment of FIG. 8 in that the first and second subpixels SPX1_1 and SPX2_1 include first to fourth contact electrodes 710A_1, 720A_1, 730A_1, and 740A_1 and first to fourth contact electrodes 710B_1, 720B_1, 730B_1, and 740B_1, respectively. The third subpixel SPX3_1 may include first to fourth sub-alignment areas AA1c, AA2c, AA3c, and AA4c. The present embodiment is different from the embodiment of FIG. 8 in that a third contact electrode of the third subpixel SPX3_1 includes first to fifth sub-contact electrodes 710C_1, 720C_1, 730C_1, 740C_1, and 750C_1. That is, in the present embodiment, the first and second subpixels SPX1_1 and SPX2_1 may include a three-stage series connection structure of the light-emitting elements disposed in the sub-alignment areas, and the third subpixel SPX3_1 may include a four-stage series connection structure of the light-emitting elements disposed in the sub-alignment areas.

Figure 18:
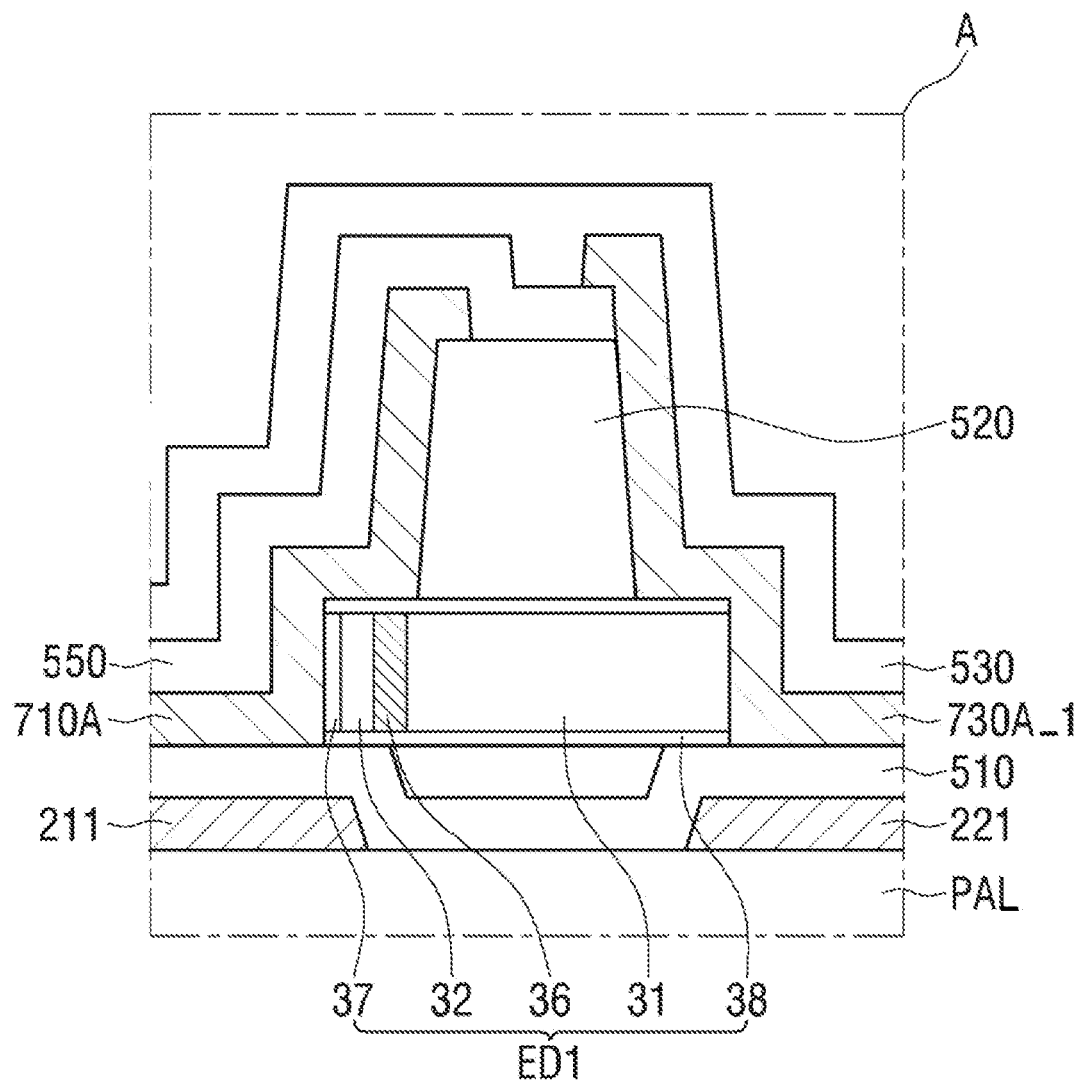
FIG. 18 is an enlarged cross-sectional view illustrating another example of area A of FIG. 9.

FIG. 18 is an enlarged cross-sectional view illustrating an example of area A of FIG. 9.

Referring to FIG. 18, a display device according to the present embodiment is different from the embodiment of FIG. 9 in that a fourth insulating layer 550 is further disposed between sub-contact electrodes. Hereinafter, the cross-sectional structure of first and second sub-contact electrodes 710A and 730A_1 of a first contact electrode disposed in a first subpixel SPX1 will be mainly described, and descriptions of other subpixels SPX will be replaced with the descriptions of the first subpixel SPX1.

For example, the fourth insulating layer 550 may be disposed between a first sub-contact electrode 710A and a second sub-contact electrode 730A_1. The fourth insulating layer 550 may be disposed on the first sub-contact electrode 710A and a second insulating layer 520, and the second sub-contact electrode 730A may be disposed on the fourth insulating layer 550. The fourth insulating layer 550 may be disposed to cover the first sub-contact electrode 710A and may serve to electrically insulate the first sub-contact electrode 710A from the second sub-contact electrode 730A_1. A third insulating layer 530 may be disposed on the fourth insulating layer 550 and the second sub-contact electrode 730A_1.

The fourth insulating layer 550 may include an inorganic insulating material or an organic insulating material. In an embodiment, as the inorganic insulating material, the fourth insulating layer 550 may include an inorganic insulating material such as silicon oxide ($SiO_x$), silicon nitride ($SiN_x$), silicon oxynitride ($SiO_xN_y$), aluminum oxide ($AlO_x$), or aluminum nitride (AlN).

In the present embodiment, a display device 10 further includes the fourth insulating layer 550 disposed between the first sub-contact electrode 710A and the second sub-contact electrode 730A_1 so that it is possible to improve the reliability of a process of patterning the first sub-contact electrode 710A and the second sub-contact electrode 730A in a process of forming the first sub-contact electrode 710A and the second sub-contact electrode 730A. Accordingly, although a separate mask process is added due to the first sub-contact electrode 710A and the second sub-contact electrode 730A being patterned through the separate mask process, the display reliability of the display device may be improved. The present embodiment is the same as the embodiment of FIG. 9 except that the fourth insulating layer 550 is further disposed, and thus, repetitive descriptions will be omitted.

In a display device according to one embodiment, the number of series connections of light-emitting elements included in first and second subpixels including the light-emitting elements that emit blue light or green light is made to be different from the number of series connections of light-emitting elements included in a third subpixel including the light-emitting elements that emit red light, thereby reducing or minimizing loss that may occur due to a difference in operating voltage between the light-emitting elements included in the subpixels. Furthermore, the subpixels are designed to have similar operating voltages, thereby facilitating the operation of each circuit.

Aspects and features of the embodiments of the present disclosure are not limited to the embodiments set forth herein and more diverse features are included in the present specification.

Although the embodiments of the present disclosure have been disclosed for illustrative purposes, those skilled in the art will appreciate that various modifications, additions and substitutions are possible, without departing from the scope and spirit of the invention as disclosed in the accompanying claims and their equivalents.

What is claimed is:

1. A display device comprising:
a first subpixel; and
a second subpixel,
wherein the first subpixel comprises a first light source unit comprising a plurality of first light-emitting elements configured to emit first light having a center wavelength of a first wavelength,
wherein the second subpixel comprises a second light source unit comprising a plurality of second light-emitting elements configured to emit second light having a center wavelength of a second wavelength,
wherein the first light source unit comprises first to $n^{th}$ light-emitting groups that are connected in series, each of the first to $n^{th}$ light-emitting groups comprising the plurality of first light-emitting elements, where n is a natural number,
wherein the second light source unit comprises first to $m^{th}$ light-emitting groups that are connected in series, each of the first to $m^{th}$ light-emitting groups comprising the plurality of second light-emitting elements, where m is a natural number,
wherein the second wavelength is different from the first wavelength, and n is different from m.

2. The display device of claim 1, wherein the second wavelength is longer than the first wavelength, and m is greater than n.

3. The display device of claim 2, wherein the first wavelength ranges from about 450 nm to about 495 nm or ranges from about 520 nm to about 575 nm, and the second wavelength ranges from about 600 nm to about 750 nm.

4. The display device of claim 3, wherein n is two, and m is three.

5. The display device according to claim 3, wherein n is three, and m is four.

6. The display device of claim 2, further comprising a third subpixel,
wherein the third subpixel comprises a third light source unit comprising a plurality of third light-emitting elements configured to emit third light having a center wavelength of a third wavelength,
wherein the third light source unit comprises first to $s^{th}$ light-emitting groups that are connected in series, each of the first to $s^{th}$ light-emitting groups comprising the plurality of third light-emitting elements, where s is a natural number,
wherein the third wavelength is different from the second wavelength, and s is different from the m.

7. The display device of claim 6, wherein the second wavelength is longer than the third wavelength, and m is greater than s.

8. The display device of claim 7, wherein the first wavelength ranges from about 450 nm to about 495 nm, the second wavelength ranges from about 600 nm to about 750 nm, and the third wavelength ranges from about 520 nm to about 575 nm.

9. The display device of claim 8, wherein n and s are the same.

10. The display device of claim 1, wherein the plurality of first light-emitting elements in each of the first to $n^{th}$ light-emitting groups of the first light source unit are connected in parallel to each other.

11. The display device of claim 10, wherein the plurality of second light-emitting elements in each of the first to $m^{th}$ light-emitting groups of the second light source unit are connected in parallel to each other.

12. The display device of claim 1, wherein each of the first and second light-emitting elements is an inorganic light-emitting diode.

13. The display device of claim 1, wherein the first light source unit further comprises a first electrode electrically connected to a first transistor of the first subpixel and a second electrode electrically connected to a first voltage line, and wherein the first to $n^{th}$ light-emitting groups of the first light source unit comprise the first light-emitting group and a second light-emitting group connected in series between the first electrode of the first light source unit and the second electrode of the first light source unit.

14. The display device of claim 13, wherein one end of the first light-emitting group of the first light source unit is connected to the first electrode of the first light source unit, wherein an other end of the first light-emitting group of the first light source unit is connected to one end of the second light-emitting group of the first light source unit, and wherein an other end of the second light-emitting group of the first light source unit is connected to the second electrode of the first light source unit.

15. The display device of claim 13, wherein the second light source unit further comprises a first electrode electrically connected to a first transistor of the second subpixel and a second electrode electrically connected to the first voltage line, and wherein the first to $m^{th}$ light-emitting groups of the second light source unit comprise the first light-emitting group, the second light-emitting group, and a third light-emitting group connected in series between the first electrode of the second light source unit and the second electrode of the second light source unit.

16. The display device of claim 15, wherein one end of the first light-emitting group of the second light source unit is connected to the first electrode of the second light source unit, wherein an other end of the first light-emitting group of the second light source unit is connected to one end of the second light-emitting group of the second light source unit, wherein an other end of the second light-emitting group of the second light source unit is connected to one end of the third light-emitting group of the second light source unit, and wherein an other end of the third light-emitting group of the second light source unit is connected to the second electrode of the second light source unit.

* * * * *